(12) United States Patent
Gwak et al.

(10) Patent No.: US 11,699,490 B2
(45) Date of Patent: Jul. 11, 2023

(54) NON-VOLATILE MEMORY DEVICE, OPERATING METHOD THEREOF, CONTROLLER FOR CONTROLLING THE SAME, AND STORAGE DEVICE INCLUDING THE SAME

(71) Applicant: Samsung Electronics Co., Ltd., Suwon-si (KR)

(72) Inventors: Soyeong Gwak, Hwaseong-si (KR); Raeyoung Lee, Suwon-si (KR); Jinkyu Kang, Seoul (KR); Sejun Park, Yongin-si (KR); Changhwan Shin, Hwaseong-si (KR); Jaeduk Lee, Seongnam-si (KR); Woojae Jang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 60 days.

(21) Appl. No.: 17/220,218

(22) Filed: Apr. 1, 2021

(65) Prior Publication Data

US 2022/0051727 A1 Feb. 17, 2022

(30) Foreign Application Priority Data

Aug. 14, 2020 (KR) .................. 10-2020-0102475

(51) Int. Cl.
| | |
|---|---|
| *G11C 16/34* | (2006.01) |
| *G11C 16/16* | (2006.01) |
| *G11C 16/26* | (2006.01) |
| *G11C 7/10* | (2006.01) |
| *G11C 16/24* | (2006.01) |
| *G11C 16/08* | (2006.01) |

(52) U.S. Cl.
CPC .............. *G11C 16/16* (2013.01); *G11C 7/106* (2013.01); *G11C 7/1087* (2013.01); *G11C 16/08* (2013.01); *G11C 16/24* (2013.01); *G11C 16/26* (2013.01); *G11C 16/349* (2013.01)

(58) Field of Classification Search
CPC .................................................. G11C 16/349
See application file for complete search history.

(56) References Cited

U.S. PATENT DOCUMENTS

| 8,839,071 | B2 | 9/2014 | Jo |
| 10,310,924 | B2 | 6/2019 | Jei et al. |
| 10,521,341 | B2 | 12/2019 | Lee |
| 2012/0137051 | A1 | 5/2012 | Masuo |
| 2012/0311394 | A1 | 12/2012 | Masuo |
| 2013/0185612 | A1 | 7/2013 | Lee et al. |
| 2018/0374552 | A1 | 12/2018 | Hong |
| 2019/0129655 | A1* | 5/2019 | Lee .................... G11C 16/10 |

(Continued)

FOREIGN PATENT DOCUMENTS

| JP | 6274127 B2 | 2/2018 |
| KR | 20130084901 A | 7/2013 |

*Primary Examiner* — Alfredo Bermudez Lozada
(74) *Attorney, Agent, or Firm* — Harness, Dickey & Pierce, P.L.C.

(57) ABSTRACT

An operating method of a storage device includes reading a wear-out pattern of a memory block when a controller determines the memory block is a re-use memory block of a non-volatile memory device; selecting an operation mode corresponding to the read wear-out pattern using the controller; and transmitting the selected operation mode to the non-volatile memory device using the controller.

10 Claims, 18 Drawing Sheets

(56) References Cited

U.S. PATENT DOCUMENTS

| | | |
|---|---|---|
| 2019/0179743 A1 | 6/2019 | Kim |
| 2020/0133835 A1* | 4/2020 | Yeh ........................ G11C 16/10 |
| 2020/0286842 A1* | 9/2020 | Sanuki .................... H01L 25/18 |
| 2020/0394114 A1 | 12/2020 | Lee et al. |

* cited by examiner

| Write | Time | Path | LV |
|---|---|---|---|
| LV1 | LV1 | ... | ... |
| LV2 | LV2 | LV3 | LV3 |
| LV3 | LV3 | LV2 | LV2 |
| ... | ... | LV1 | LV1 |

NON-VOLATILE MEMORY DEVICE, OPERATING METHOD THEREOF, CONTROLLER FOR CONTROLLING THE SAME, AND STORAGE DEVICE INCLUDING THE SAME

CROSS-REFERENCE TO RELATED APPLICATION(S)

This application claims the benefit of priority to Korean Patent Application No. 10-2020-0102475, filed on Aug. 14, 2020 in the Korean Intellectual Property Office, the disclosure of which is incorporated herein by reference in its entirety.

BACKGROUND

Example embodiments of the present disclosure relate to a non-volatile memory device, an operating method thereof, a controller for controlling the same, and/or a storage device including the same.

In general, as a non-volatile memory, a flash memory may maintain stored data even when power is cut off. Recently, a storage device including a flash memory such as an embedded multi-media card (eMMC), a universal flash storage (UFS), a solid state drive (SSDs), and a memory card, has been widely used. A storage device has been used to store or move large amounts of data. There has been continuous demand for a technique of improving reliability of a storage device.

SUMMARY

An example embodiment of the present disclosure is to provide a non-volatile memory device which may improve reliability of data, an operating method thereof, a controller for controlling the same, and/or a storage device including the same.

According to an example embodiment of the present disclosure, an operating method of a storage device includes reading a wear-out pattern of a memory block when a controller determines the memory block is a re-use memory block of a non-volatile memory device; selecting an operation mode corresponding to the read wear-out pattern using the controller; and transmitting the selected operation mode to the non-volatile memory device using the controller.

According to an example embodiment of the present disclosure, a non-volatile memory device includes a memory cell region and a peripheral circuit region. The memory cell region has a first metal pad and includes a memory cell array. The memory cell array includes a plurality of memory blocks having a plurality of memory cells connected to a plurality of word-lines and a plurality of bit-lines in the memory cell region. The peripheral circuit region has a second metal pad and is vertically connected to the first metal pad through the second metal pad. The peripheral circuit region includes a row decoder configured to select one of the plurality of word-lines in the peripheral circuit region, a page buffer circuit having a plurality of page buffers connected to the plurality of bit-lines, and a control logic. The control logic is configured to receive a command latch enable (CLE) signal, an address latch enable (ALE) signal, a chip enable (CE) signal, a write enable (WE) signal, a read enable (RE) signal, and a DQS signal through control pins, and to latch a command or an address on an edge of the WE signal according to the CLE signal and the ALE signal, for performing an advanced operation. The advanced operation includes a program operation, a read operation, or an erase operation according to an advanced operation mode different from a normal operation mode to improve reliability.

According to an example embodiment of the present disclosure, a controller includes control pins, an error correction circuit, and at least one processor. The control pins are configured to provide a command latch enable (CLE) signal, an address latch enable (ALE) signal, a chip enable (CE) signal, a write enable (WE) signal, a read enable (RE) signal, and a DQS signal to at least one non-volatile memory device. The error correction circuit is configured to receive data of a patrol read operation for a memory block from the at least one non-volatile memory device and to correct an error of the received data. The at least one processor is configured to perform a reclaim on the memory block when a number of errors corrected in the error correction circuit is equal to or greater than a reference value, to determine a wear-out reason for the memory block, to write a wear-out pattern for the wear-out reason in the memory block, to read the wear-out pattern when the memory block is reused, to select an operation mode according to the wear-out pattern, and to perform a program operation, a read operation, or an erase operation for the memory block of the at least one non-volatile memory device according to the selected operation mode.

According to an example embodiment of the present disclosure, a storage device includes at least one non-volatile memory device; and a controller connected to the at least one non-volatile memory device through control pins. The controller is configured to provide a command latch enable (CLE) signal, an address latch enable (ALE) signal, a chip enable (CE) signal, a write enable (WE) signal, a read enable (RE) signal, and a DQS signal to the at least one non-volatile memory device and configured to read data from the at least one non-volatile memory device. The at least one non-volatile memory device is configured, by latching a command or an address on an edge of the WE signal according to the CLE signal and the ALE signal, to perform a core operation for improving reliability. The controller is configured to check a wear-out pattern of a memory block of the non-volatile memory device to perform the core operation, and select a word-line recovery mode using the wear-out pattern. The at least one non-volatile memory device is configured to perform the core operation according to the selected word-line recovery mode by the controller.

BRIEF DESCRIPTION OF DRAWINGS

The above and other aspects, features, and effects of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

In example embodiments, a non-volatile memory device, a controller for controlling the same, a storage device including the same, and/or an operating method thereof may select an optimal operation mode according to wear-out information when a memory block is reused, and may perform a core operation (e.g., a program operation, a read operation, an erase operation, etc.) according to the selected optimal operation mode to improve reliability.

Figure 1:
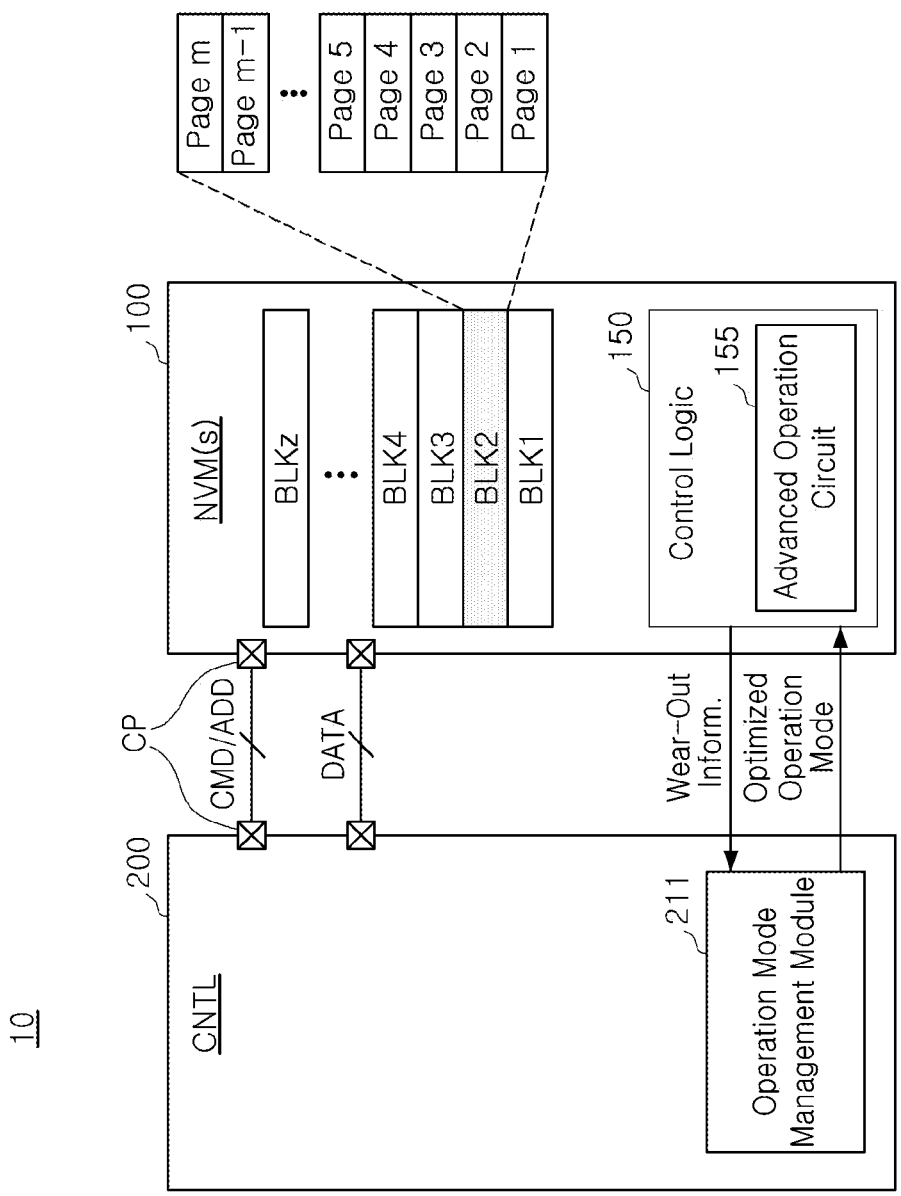
FIG. 1 is a diagram illustrating a storage device according to an example embodiment of the present disclosure.

FIG. 1 is a diagram illustrating a storage device 10 according to an example embodiment. Referring to FIG. 1, the storage device 10 may include at least one non-volatile memory device NVM(s) 100 and a controller CNTL 200.

The at least one non-volatile memory device 100 may be implemented to store data. The non-volatile memory device 100 may be implemented by a NAND flash memory, a vertical NAND flash memory, a NOR flash memory, a resistive random access memory (RRAM), and a phase-change memory. Memory (PRAM), a magnetoresistive random access memory (MRAM), a ferroelectric random access memory (FRAM), a spin transfer torque random access memory (STT-RAM), or the like. Also, the non-volatile memory device 100 may be implemented in a three-dimensional array structure. The example embodiment may also be applicable to a charge trap flash (CTF) in which a charge storage layer is formed of an insulating film. In the description below, the non-volatile memory device 100 will be referred to as a vertical NAND flash memory device (VNAND) for ease of description.

The non-volatile memory device 100 may be implemented to include a plurality of memory blocks BLK1 to BLKz, (where z is an integer equal to or greater than 2) and a control logic 150.

Each of the plurality of memory blocks BLK1 to BLKz may include a plurality of pages Page 1 to Page m (m is an integer equal to or greater than 2). Each of the plurality of pages Page 1 to Page m may include a plurality of memory cells. Each of the plurality of memory cells may be configured to store at least one bit.

Also, each of the plurality of memory blocks BLK1 to BLKz may be implemented to store wear-out information when being processed as an invalidation block. In an example embodiment, the wear-out information may include a specific pattern. The wear-out information of a specific pattern may be stored in a desired and/or alternatively predetermined position (a cell region or a spare region) in the corresponding memory block. However, an example of the wear-out information is not limited thereto. In an embodiment, the wear-out information of the memory block may not be stored in a specific pattern. For example, the wear-out information may include structural characteristic information, word-line profile information, or cycle characteristic information.

The control logic 150 may receive a command (CMD) and an address (ADD) from a controller CNTL (200), and may perform an operation (e.g., a program operation, a read operation, an erase operation, or the like) corresponding to the received command CMD on memory cells corresponding to the address ADD.

The control logic 150 may include an advanced operation circuit 155. The advanced operation circuit 155 may be implemented to perform an operation (a program operation, a read operation, an erase operation) according to an advanced operation mode different from a normal operation mode. The advanced operation mode may be configured as an optimal operation mode for improving reliability received from the controller 200.

The controller CNTL (200) may be connected to at least one non-volatile memory device 100 through a plurality of control pins CP for transmitting control signals (e.g., a CLE, an ALE, a CE(s), a WE, an RE, etc.). Also, the controller CNTL (200) may be implemented to control the non-volatile memory device 100 using control signals (a CLE, an ALE, a CE(s), a WE, an RE, etc.). For example, the non-volatile memory device 100 may latch a command (CMD) or an address (ADD) on an edge of a write enable (WE) signal according to a command latch enable (CLE) signal and an address latch enable (ALE) signal, thereby performing a program operation, a read operation, and/or an erase operation.

Also, the controller 200 may include an operation mode management module 211. The operation mode management module 211 may, when the memory block is reused, read wear-out information of a corresponding memory block from the non-volatile memory device 100, may select an optimal operation mode of the memory block on the bases of the read wear-out information, and may transmit the selected optimal operation mode to the non-volatile memory device 100. In an example embodiment, the non-volatile memory device 100 may be configured to perform an operation in response to receiving the selected optimal operation mode and/or a command. In an example embodiment, the operation mode management module 211 may be implemented in hardware (e.g., processing circuitry), software, or firmware. In an example embodiment, although the operation mode management module 211 is not illustrated, but the operation mode management module 211 may be executed in at least one processor provided in the controller 200.

A general storage device may perform an operation according to the same operation mode regardless of reliability characteristics of a memory block when the memory block is reused, which may cause a reliability problem of the reused memory block.

The storage device 10 in an example embodiment may, when and/or in response to reusing a memory block, read wear-out information (e.g., information indicating reliability characteristics of the memory block), may select an optimal operation mode for improving reliability on the basis of the wear-out information, and may perform an operation according to the selected optimal operation mode, thereby improving reliability of the memory block after reusing the memory block.

Figure 2:
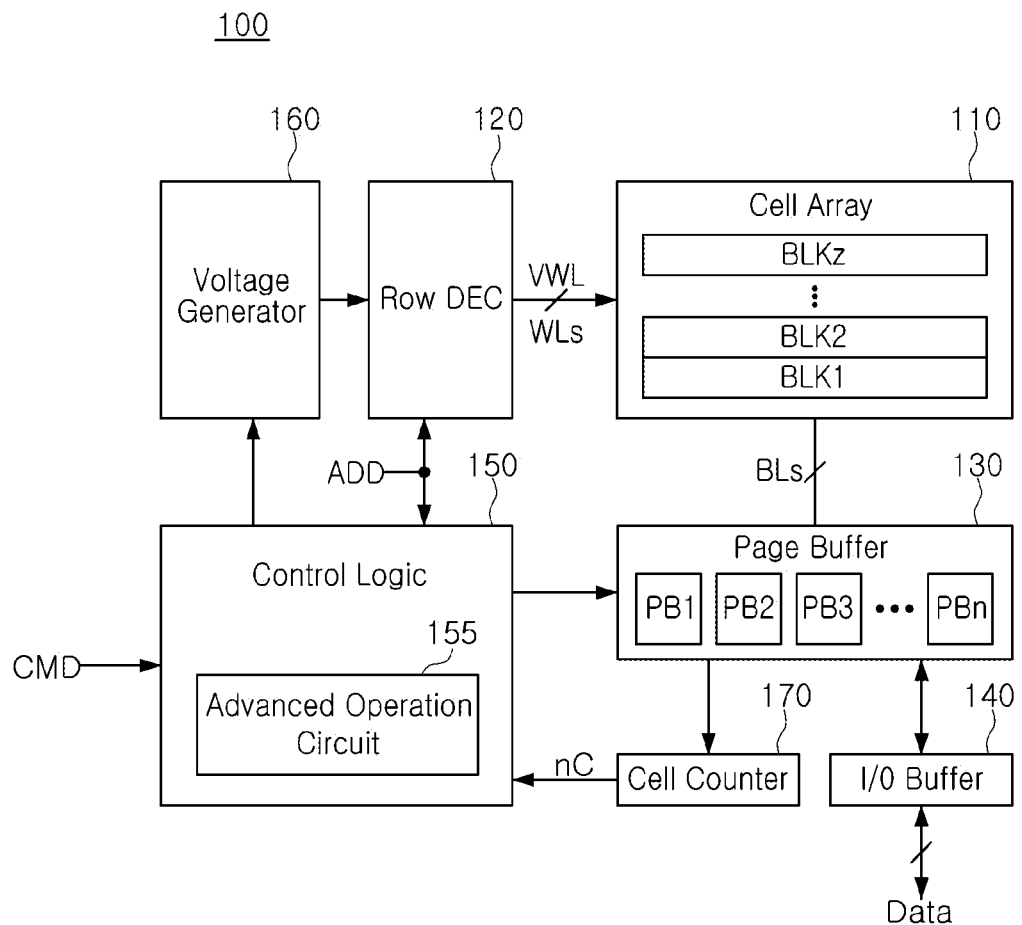
FIG. 2 is a diagram illustrating a non-volatile memory device illustrated in FIG. 1 according to an example embodiment of the present disclosure.

FIG. 2 is a diagram illustrating a non-volatile memory device 100 illustrated in FIG. 1 according to an example embodiment. Referring to FIG. 2, the non-volatile memory device 100 may include a memory cell array 110, a row decoder 120, a page buffer circuit 130, an input/output buffer circuit 140, a control logic 150, a voltage generator 160, and a cell counter 170.

The memory cell array 110 may be connected to the row decoder 120 through word-lines WLs or select lines SSL and GSL. The memory cell array 110 may be connected to the page buffer circuit 130 through bit-lines BLs. The memory cell array 110 may include a plurality of cell strings. A channel of each of the cell strings may be formed in a vertical or horizontal direction. Each of the cell strings may include a plurality of memory cells. The plurality of memory cells may be programmed, erased, or read by a voltage provided to the bit-lines BLs or word-lines WLs. In general, a program operation is performed by a page unit and an erase operation is performed by a block unit.

The row decoder 120 may be implemented to select one of the memory blocks BLK1 to BLKz of the memory cell array 110 in response to the address ADD. The row decoder 120 may select one of the word-lines of the selected memory block in response to the address ADD. The row decoder 120 may transfer the word-line voltage VWL corresponding to the operation mode to the word-line of the selected memory block. During the program operation, the row decoder 120 may apply a program voltage and a verify voltage to the selected word-line, and may apply a pass voltage to the unselected word-line. During a read operation, the row decoder 120 may apply a read voltage to a selected word-line and a read pass voltage to an unselected word-line.

The page buffer circuit 130 may be implemented to operate as a write driver or a sensing amplifier. During the program operation, the page buffer circuit 130 may apply a bit-line voltage corresponding to data to be programmed to the bit-lines of the memory cell array 110. During a read operation or a verify read operation, the page buffer circuit 130 may sense data stored in the selected memory cell through the bit-line BL. Each of the plurality of page buffers PB1 to PBn (n is an integer equal to or greater than 2) included in the page buffer circuit 130 may be connected to at least one bit-line.

Each of the plurality of page buffers PB1 to PBn may be implemented to perform sensing and latching for performing an on-chip valley search (OVS) operation. In other words, each of the plurality of page buffers PB1 to PBn may perform a plurality of sensing operations to identify a state stored in the selected memory cells under control of the control logic 150. Also, after each of the plurality of page buffers PB1 to PBn may store data sensed through the plurality of sensing operations, and may select one of data under the control of the control logic 150. Accordingly, each of the plurality of page buffers PB1 to PBn may perform a plurality of sensing operations to identify a state. Also, each of the plurality of page buffers PB1 to PBn may select or output optimal data from among a plurality of pieces of sensed data under control of the control logic 150.

The input/output buffer circuit 140 may provide data provided from an external entity to the page buffer circuit 130. The input/output buffer circuit 140 may provide a command CMD provided from an external entity to the control logic 150. The input/output buffer circuit 140 may provide an address ADD provided from an external entity to the control logic 150 or the row decoder 120. Also, the input/output buffer circuit 140 may output sensed and latched data by the page buffer circuit 130 to an external entity.

The control logic 150 may be implemented to control the row decoder 120 and the page buffer circuit 130 in response to a command CMD transmitted from an external entity.

The control logic 150 may include an advanced operation circuit 155 performing an operation in an optimal operation mode for improving reliability. The advanced operation circuit 155 may be implemented to control the page buffer circuit 130 and the voltage generator 160 for optimal operation for improving reliability. For example, the advanced operation circuit 155 may perform word-line recovery control for setting a floating state of a word-line to an optimum state to improve reliability.

The control logic 150 may be implemented to perform processing for selecting optimal data from among a plurality of pieces of sensed data. To select optimal data, the control logic 150 may refer to a count result nC provided from the cell counter 170.

The voltage generator 160 may be implemented to generate various types of word-line voltages to be applied to each word-line under the control of the control logic 150, and a well voltage to be supplied to a bulk (e.g., a well region) in which memory cells are formed. Word-line voltages applied to the word-lines may include a program voltage, a pass voltage, a read voltage, and a read pass voltage.

The cell counter 170 may be implemented to count memory cells corresponding to a specific threshold voltage range from data sensed by the page buffer circuit 130. For example, the cell counter 170 may count the number of memory cells having a threshold voltage in a specific threshold voltage range by processing data sensed in each of the plurality of page buffers PB1 to PBn.

The non-volatile memory device 100 in an example embodiment may, by performing a program/read/erase operation according to an optimal operation mode for improving reliability received from the controller 200, may improve reliability.

Figure 3A:
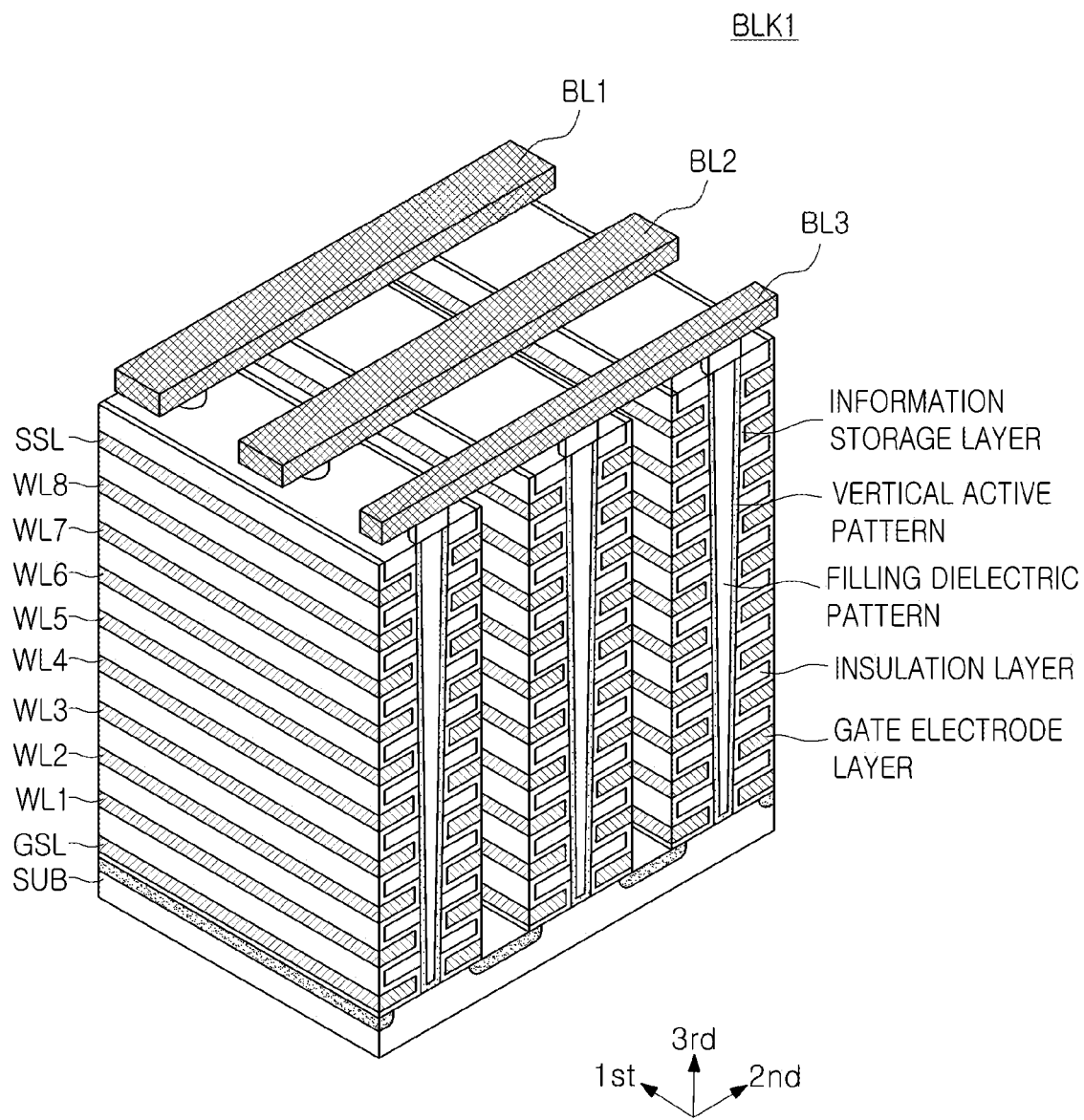
FIG. 3A is a diagram illustrating a memory block.

FIG. 3A is a diagram illustrating an example of a memory block. Referring to FIG. 3A, the memory block BLK1 may be formed in a direction perpendicular to the substrate SUB. An n+ doped region may be formed on the substrate SUB.

A gate electrode layer and an insulation layer may be alternately deposited on the substrate SUB. An information storage layer may be formed between the gate electrode layer and the insulation layer. When the gate electrode layer and the insulating layer are vertically patterned, a V-shaped pillar may be formed. The pillar may pass through the gate electrode layer and the insulating layer and may be connected to the substrate SUB. An internal region of the pillar may be formed of an insulating material such as silicon oxide as a filling dielectric pattern. An external region of the pillar may be formed of a channel semiconductor in a vertical active pattern.

The gate electrode layer of the memory block BLK1 may be connected to a ground select line GSL, a plurality of word-lines WL1 to WL8, and a string select line SSL. Further, a pillar of the memory block BLK1 may be connected to a plurality of bit-lines BL1 to BL3. In FIG. 3A, a single memory block BLK1 may have two selection lines GSL and SSL, eight word-lines WL1 to WL8, and three bit-lines BL1 to BL3, but example embodiments are not limited thereto.

Figure 3B:
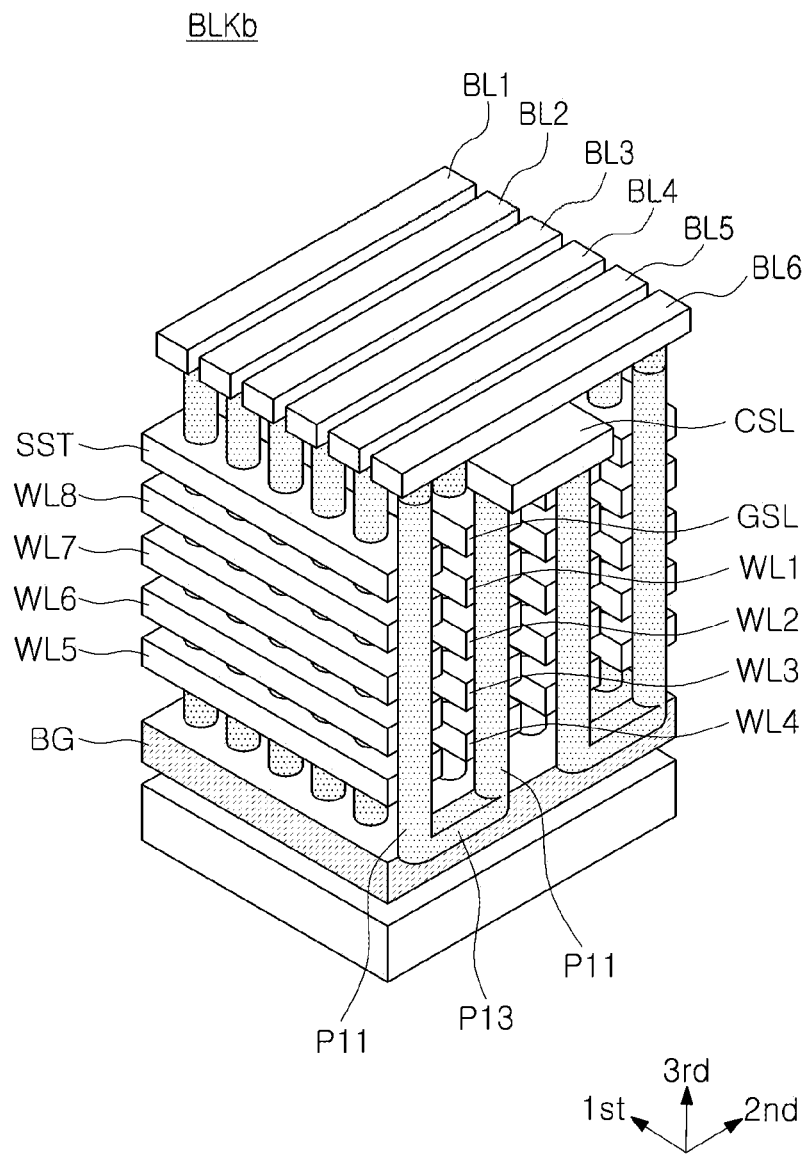
FIG. 3B is a diagram illustrating another example of a memory block according to an example embodiment of the present disclosure.

FIG. 3B is a diagram illustrating another example of a memory block. Referring to FIG. 3B, the number of word-lines of the memory block BLKb may be 4 for ease of description. The memory block BLKb may be implemented in a bit cost scalable (BIC) structure in which lower ends of adjacent memory cells connected in series are connected by pipes. The memory block BLKb may include a plurality of strings NS.

Each string NS may include memory cells MC1 to MC8 connected in series. First upper ends of the memory cells MC1 to MC8 may be connected to the string select transistor SST, second upper ends of the memory cells MC1 to MC8 may be connected to the ground select transistor GST, and lower ends of the memory cells MC1 to MC8 may be connected by pipes. Memory cells included in the string NS may be formed by stacking on a plurality of semiconductor layers. Each string NS may include a pillar connection portion PL13 connecting the first pillar PL11, the second pillar PL12, the first pillar PL11, and the second pillar PL12. The first pillar PL11 may be connected to the bit-line (for example, BL1) and the pillar connector PL13, and may be formed by penetrating through the string select line SSL and the word-lines WL5 to WL8. The second pillar PL12 may be connected to the common source line CSL and the pillar connection portion PL13, and may be formed by penetrating through the ground select line GSL and the word-lines WL1 to WL4. As illustrated in FIG. 3B, the string NS may be implemented in a U-shaped pillar shape.

In an example embodiment, the back-gate BG may be formed on a substrate, and a pillar connection portion PL13 may be implemented in the back-gate BC. In an example embodiment, the back-gate BG may be present in common in the block BLKb. The back-gate BG may be configured to be separated from the back-gate of another block. For ease of description, the number of layers of the word-line may be 4, but is not limited thereto. The memory block BLKb may be implemented in a bit cost scalable (BIC) structure in which lower ends of adjacent memory cells connected in series are connected by pipes.

Figure 4:
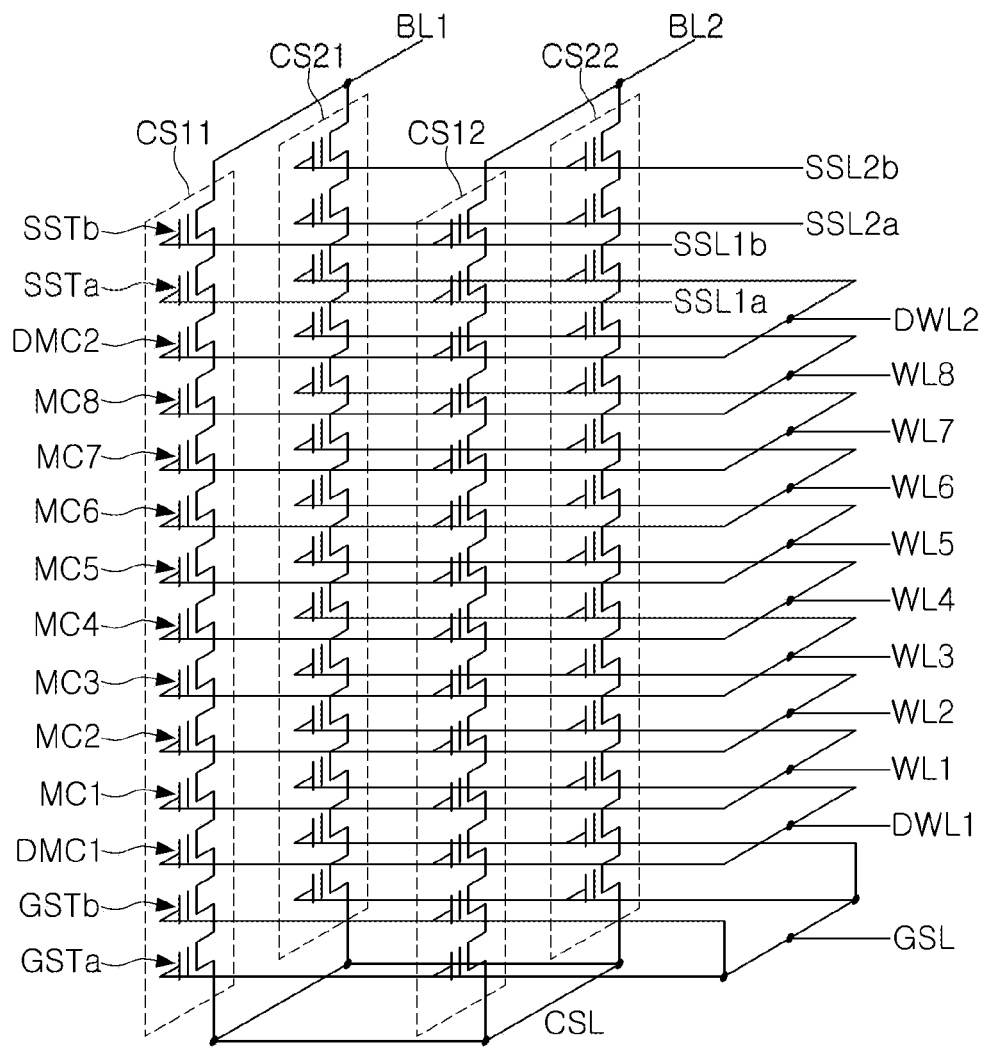
FIG. 4 is a circuit diagram illustrating one of memory blocks illustrated in FIG. 1 according to an example embodiment of the present disclosure.

FIG. 4 is a circuit diagram of one of memory blocks BLK1 illustrated in FIG. 1. Referring to FIG. 4, a memory block BLK1 having a three-dimensional structure is illustrated. The memory block BLK1 may include a plurality of cell strings CS11, CS12, CS21, and CS22. The plurality of cell strings CS11, CS12, CS21, and CS22 may be disposed along a row direction and a column direction and may form rows and columns.

In an example embodiment, the cell strings CS11 and CS12 may be connected to the string select lines SSL1a and SSL1b and may form a first row. The cell strings CS21 and CS22 may be connected to the string select lines SSL2a and SSL2b and may form a second row. For example, the cell strings CS11 and CS21 may be connected to the first bit-line BL1 and may form a first column. The cell strings CS12 and CS22 may be connected to the second bit-line BL2 and may form a second column.

Each of the plurality of cell strings CS11, CS12, CS21, and CS22 may include a plurality of cell transistors. For example, each of the plurality of cell strings CS11, CS12, CS21, CS22 may include string select transistors SSTa and SSTb, a plurality of memory cells MC1 to MC8, ground select transistors GSTa and GSTb, and dummy memory cells DMC1 and DMC2. For example, each of the plurality of cell transistors included in the plurality of cell strings CS11, CS12, CS21, and CS22 may be a charge trap flash (CTF) memory cell.

The plurality of memory cells MC1 to MC8 may be connected in series, and may be stacked in a height direction perpendicular to a plane formed by a row direction and a column direction. The string select transistors SSTa and SSTb may be connected in series, and the string select transistors SSTa and SSTb connected in series may be provided between the plurality of memory cells MC1 to MC8 and the bit-line BL. The ground select transistors GSTa and GSTb may be connected in series, and the ground select transistors GSTa and GSTb connected in series may be provided between the plurality of memory cells MC1 to MC8 and the common source line CSL.

In an example embodiment, a first dummy memory cell DMC1 may be provided between the plurality of memory cells MC1 to MC8 and the ground select transistors GSTa and GSTb. For example, a second dummy memory cell DMC2 may be provided between the plurality of memory cells MC1 to MC8 and the string select transistors SSTa and SSTb.

Ground select transistors GSTa and GSTb of the cell strings CS11, CS12, CS21, CS22 may be connected to the ground select line GSL in common. For example, ground select transistors of the same row may be connected to the same ground select line, and ground select transistors of another row may be connected to another ground select line. For example, the first ground select transistors GSTa of the cell strings CS11 and CS12 of the first row may be connected to the first ground select line, and similarly, string select transistors of the same row of the second string select transistors SSTb having the same height may be connected to the same string select line, and string select transistors of another row may be connected to another string select line. For example, the second string select transistors SSTb of the cell strings CS11 and CS12 of the first row may be connected to the string select line SSL1b in common, and the second string select transistors SSTb of the cell strings CS21 and CS22 of the second row may be connected to the string select line SSL2b in common.

Although not illustrated, string select transistors of cell strings of the same row may be connected to the same string select line in common. For example, the first and second string select transistors SSTa and SSTb of the cell strings CS11 and CS12 of the first row may be connected to the same string select line in common. The first and second string select transistors SSTa and SSTb of the cell strings CS21 and CS22 of the second row may be connected to the same string select line in common.

In an example embodiment, dummy memory cells having the same height may be connected to the same dummy word-line, and dummy memory cells having different heights may be connected to other dummy word-lines. For example, the first dummy memory cells DMC1 may be connected to the first dummy word-line DWL1, and the second dummy memory cells DMC2 may be connected to the second dummy word-line DWL2.

In the first memory block BLK1, erasing may be performed by memory block unit or sub-block unit. When erasing is performed by memory block unit, all the memory cells MC of the first memory block BLK1 may be simultaneously erased according to a single erase request. When erasing is performed by sub-block unit, a portion of the memory cells MC of the first memory block BLK1 may be simultaneously erased according to a single erase request, and the other portion of the memory cells may be erase-prohibited. A low voltage (e.g., a ground voltage) may be supplied to a word-line connected to the erased memory cells, and a word-line connected to the erase-prohibited memory cells may be floated.

The first memory block BLK1 illustrated in FIG. 4 is an example. Depending on the number of cell strings, the number of rows, the number of columns, the number of cell transistors, the number of lines (GST, MC, DMC, SST, etc.) connected to the cell transistors is not limited to any particular example.

Figure 5:
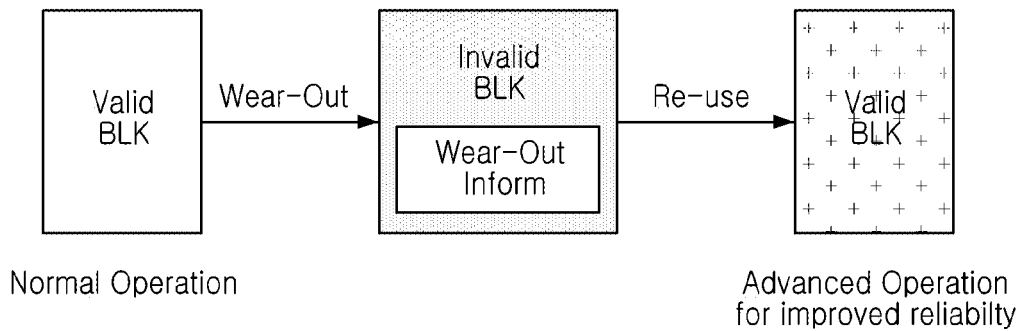
FIG. 5 is a diagram illustrating a method of managing blocks of a non-volatile memory device according to an example embodiment of the present disclosure.

FIG. 5 is a diagram illustrating a method of managing blocks of a non-volatile memory device 100 according to an example embodiment. Referring to FIG. 5, a normal operation may be performed on an initial valid block. Thereafter, as the memory block wears out, the valid block may be treated as an invalid block according to the block management policy of the storage device 10. In this case, when processing the memory block as an invalid block, wear-out information may be stored. Thereafter, the storage device 10 may reuse the invalid block according to the block management policy. In this case, the storage device 10 may perform an advanced operation for improving reliability for the reused memory block using the wear-out information. The advanced operation may perform a core operation (a program operation, a read operation, and an erase operation) different from the normal operation.

In an example embodiment, the advanced operation may include a WL (Wordline) recovery control operation after a program operation, a verify operation, or a read operation. In an example embodiment, the WL recovery control may include WL recovery time control/level control/slope control through path. In an example embodiment, an ERASE level of a shallow erase operation or a deep erase operation may be determined according to the wear-out information.

In an example embodiment, the verification level of the program state may be varied according to the wear-out information. For example, in the advanced operation, the verification level of the upper program state may be lowered.

In an example embodiment, a multi-bit program operation may be varied according to the wear-out information. For example, a TLC program operation may be performed in a normal operation, an MLC/SLC program operation may be performed in the advanced operation.

In an example embodiment, a program scheme may be varied according to the wear-out information. For example, a high speed program (HSP) may be used in the normal operation, and a SUN WHO PGM may be used in the advanced operation.

Figure 6:
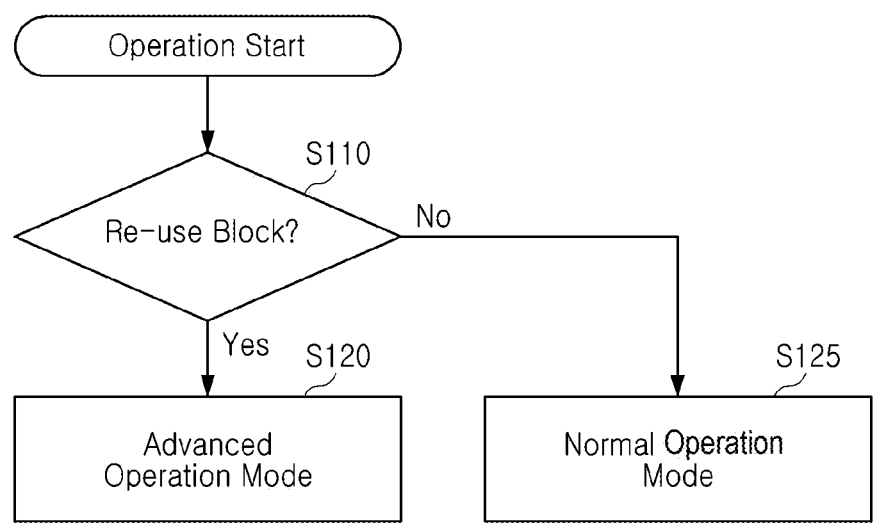
FIG. 6 is a flowchart illustrating an operation mode of a storage device according to an example embodiment of the present disclosure.

FIG. 6 is a flowchart illustrating an operation mode of a storage device according to an example embodiment. Referring to FIG. 6, the controller 200 (see FIG. 1) of the storage device 10 may determine whether a memory block to perform an operation is a reuse block (S110). When the memory block is a reuse block, the controller 200 may select an advanced operation mode for improving reliability and may transmit the selected advanced operation mode to the non-volatile memory device 100 (see FIG. 1) as an optimal operation mode (S120). When the memory block is not a reuse block, the controller 200 may select a normal operation mode and may transmit the selected normal operation mode to the non-volatile memory device 100 as an optimal operation mode (S125).

The storage device 10 in an example embodiment may store a wear-out pattern corresponding to the wear-out information when a memory block is invalidated (when neglected).

Figure 7A:
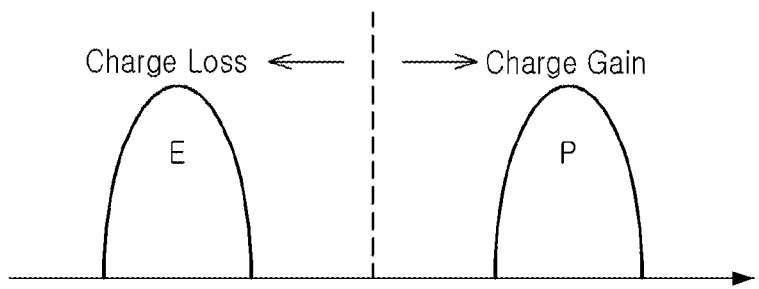
FIGS. 7A and 7B are diagrams illustrating methods of storing a wear-out pattern according to an example embodiment of the present disclosure.
Figure 7B:
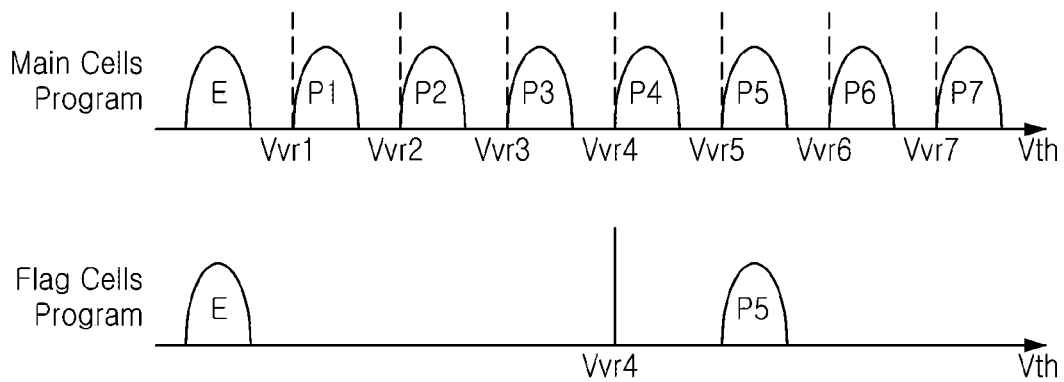

FIGS. 7A and 7B are diagrams illustrating methods of storing a wear-out pattern according to an example embodiment.

Referring to FIG. 7A, the wear-out pattern may be stored in at least one single level cell (SLC). When the wear-out characteristic is charge loss, the wear-out pattern may be recorded as an erased state (E). When the wear-out is a charge gain, the wear-out pattern may be recorded as a program state. In an example embodiment, at least one SLC storing the wear-out pattern may be a cell connected to a desired and/or alternatively predetermined word-line of a memory block to be reused. In another example embodiment, the at least one SLC storing the wear-out pattern may be a cell connected to a desired and/or alternatively predetermined word-line of a valid memory block rather than a memory block to be reused. In an example embodiment, at least one SLC storing the wear-out pattern may be included in the user block. In another embodiment, at least one SLC storing the wear-out pattern may be included in a meta block.

Referring to FIG. 7B, the wear-out pattern may be stored in at least one flag cell. By a main cell program operation, user data may be stored in a triple level cell (TLC) as illustrated in FIG. 7B. By the flag cell program operation, a wear-out pattern may be stored in the flag cell as illustrated in FIG. 7B. For example, the fourth verification level Vvr4 may be a level for classifying the state of the wear-out pattern. When the flag cell is an on-cell by the fourth verification level Vvr4, the wear-out pattern may indicate charge loss. When the flag cell is an off-cell by the fourth verification level Vvr4, the wear-out pattern may indicate charge gain.

It should be understood that the number of bits or the verification level of a memory cell used to distinguish a wear-out pattern in an example embodiment is merely an example and example embodiments are not limited thereto.

It has been described that the operation mode management module 211 (see FIG. 1) of the storage device 10 in an example embodiment may select the advanced operation mode when the memory block is reused, but an example embodiment thereof is not limited thereto. The selection of an operation mode is not limited to the advanced operation mode when the memory block is reused. In an example embodiment, a normal operation mode or an advanced operation mode may be selected on the basis of the wear-out information of a memory block.

Figure 8A:
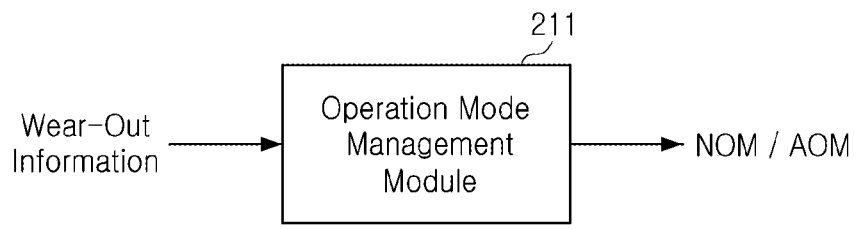
FIGS. 8A and 8B are diagrams illustrating mode selection of an operation mode management module according to an example embodiment of the present disclosure.
Figure 8B:
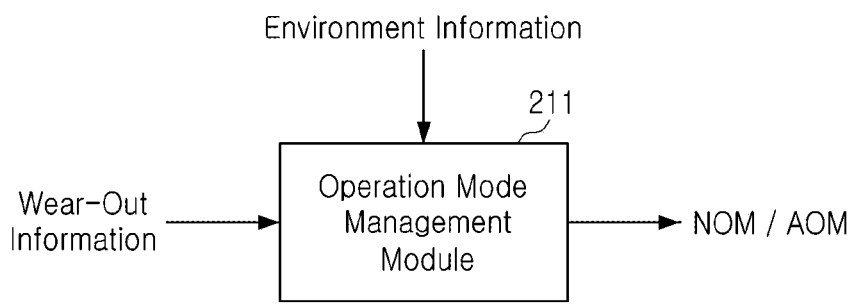

FIGS. 8A and 8B are diagrams illustrating mode selection of an operation mode management module according to an example embodiment. Referring to FIG. 8A, the operation mode management module 211 may receive wear-out information of a memory block to perform an operation, and may select a normal operation mode (NOM) or an advanced operation mode (AOM) on the basis of the wear-out information. Referring to FIG. 8B, the operation mode management module 211 may receive the wear-out information and environmental information (program/erase (P/E) cycle, read cycle, elapsed time information, temperature information, block position information, etc.), and may reflect the received wear-out information and environmental information comprehensively to select a normal operation mode (NOM) or an advanced operation mode (AOM).

The controller 200 of the storage device 10 in an example embodiment may simultaneously transmit an optimal operation mode when transmitting a command.

Figure 9A:
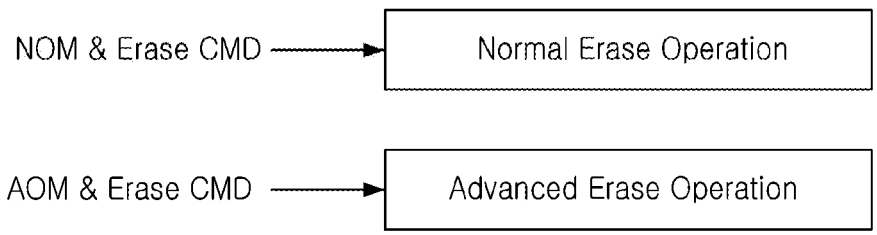
FIGS. 9A, 9B, and 9C are diagrams illustrating an erase command, a program command, and a read command transmitted along with an operation mode according to an example embodiment of the present disclosure.
Figure 9B:
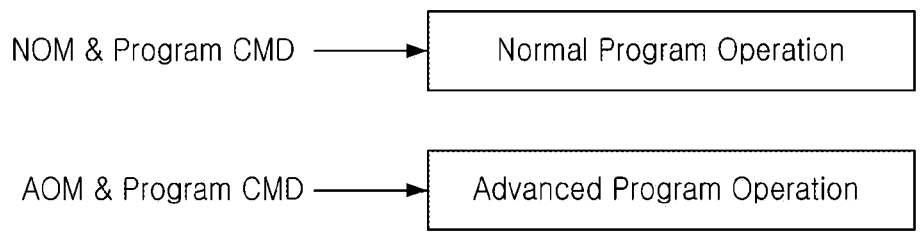
Figure 9C:
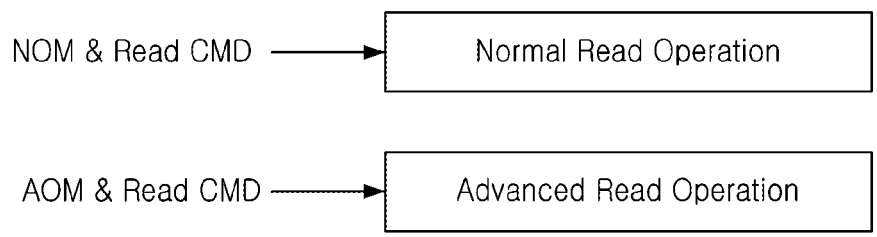

FIGS. 9A, 9B, and 9C are diagrams illustrating examples of an erase command, a program command, and a read command transmitted along with an operation mode As illustrated in FIG. 9A, when a normal operation mode NOM and an erase command are received, for example by the control logic 150, the non-volatile memory device 100 may perform a normal erase operation. When an advanced operation mode AOM and an erase command are received, for example by the control logic 150, the non-volatile memory device 100 may perform an advanced erase operation.

As illustrated in FIG. 9B, when a normal operation mode NOM and a program command are received, for example by the control logic 150, the non-volatile memory device 100 may perform a normal program operation. When an advanced operation mode AOM and a program command are received, for example by the control logic 150, the non-volatile memory device 100 may perform an advanced program operation.

As illustrated in FIG. 9C, when a normal operation mode NOM and a read command are received, for example by the control logic 150, the non-volatile memory device 100 may perform a normal read operation. When an advanced operation mode AOM and a read command are received, for example by the control logic 150, the non-volatile memory device 100 may perform an advanced read operation.

The advanced erase operation, the advanced program operation, and the advanced read operation illustrated in FIGS. 9A, 9B, and 9C may include an operation for further improving reliability more than those of the normal mode.

The storage device 10 in an example embodiment may select an advanced operation mode according to the type of program.

Figure 10:
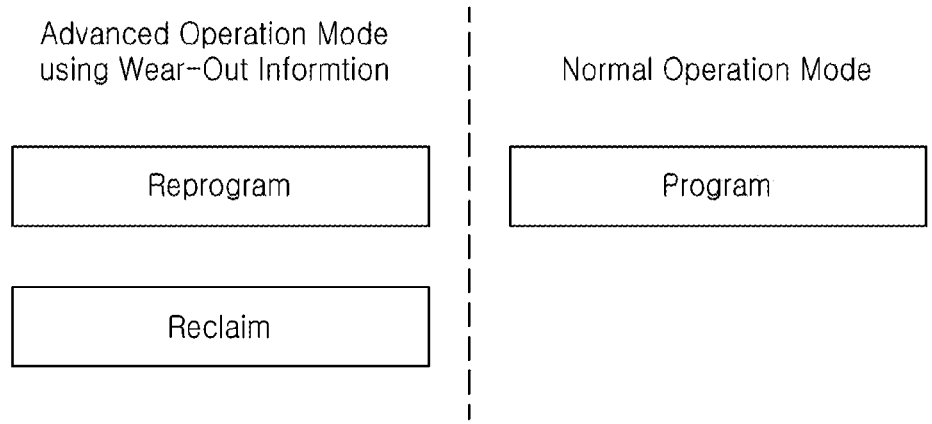
FIG. 10 is a diagram illustrating selection of an operation mode according to a program type according to an example embodiment of the present disclosure.

FIG. 10 is a diagram illustrating selection of an operation mode according to a program type according to an example embodiment. Referring to FIG. 10, a default program operation may be performed in a normal operation mode. A reprogram operation or a reclaim operation may be performed in an advanced operation mode using the wear-out information.

The non-volatile memory device 100 (see FIG. 1) in an example embodiment may perform a word-line recovery control operation for improving reliability. The word-line recovery control operation may include an operation of setting a floating word-line voltage when performing the word-line recovery operation. In general, a flash memory device using a floating channel may have an optimum retention characteristic according to a word-line to channel potential. Therefore, improvement of reliability through word-line recovery control may be available.

Figure 11A:
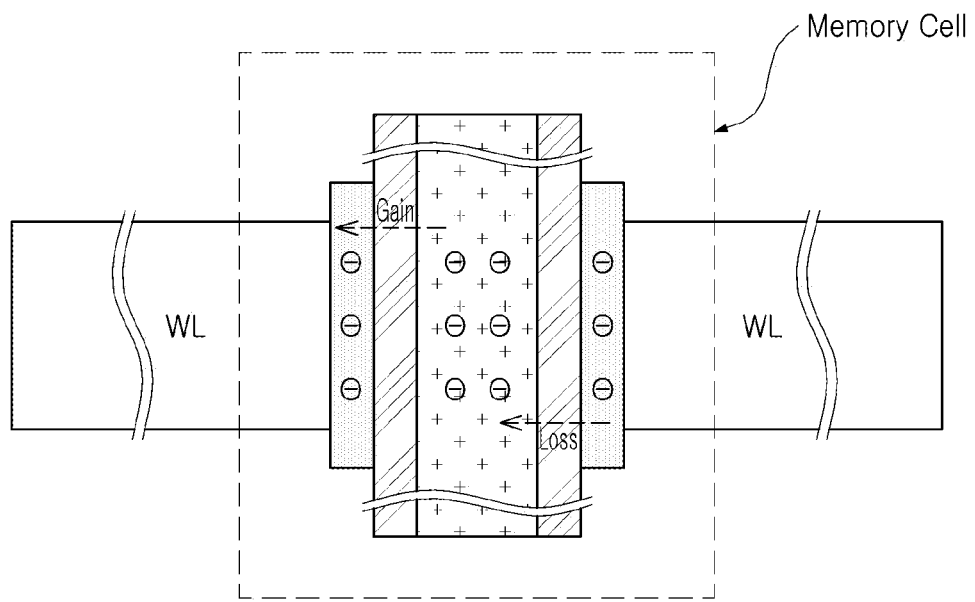
FIGS. 11A and 11B are diagrams illustrating a word-line recovery operation of a non-volatile memory device according to an example embodiment of the present disclosure.
Figure 11B:
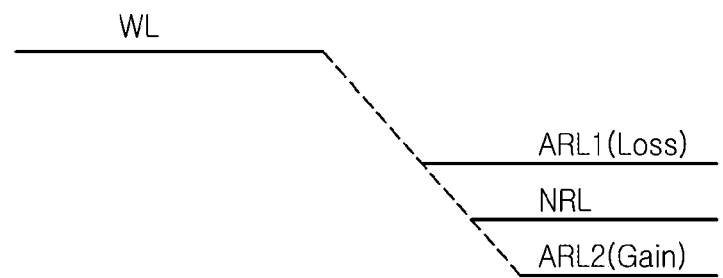

FIGS. 11A and 11B are diagrams illustrating an example of a word-line recovery operation of a non-volatile memory device 100.

Referring to FIG. 11A, electrons in an information storage layer of a memory cell may be lost to a channel or may flow into from a channel depending on an environment. This transfer of electric charge may refer to deterioration of the memory cell. However, when the floating state of the word-line WL is varied according to the state of the memory cell, the level of deterioration of the memory cell may improve later.

As illustrated in FIG. 11B, when indicating a charge loss state of a memory cell, a word-line recovery operation may be performed at the first advanced recovery level ARL1. In this case, the floating word-line WL may have a set word-line level (ARL1>NRL) higher than a recovery level NRL of the normal operation. By setting the voltage of the floating word-line WL relatively high, charge loss may be relatively reduced as compared to the example in which the voltage is not relatively high.

As illustrated in FIG. 11B, when indicating the charge gain state of the memory cell, the word-line recovery operation may be performed at the second advanced recovery level ARL2. In this case, the floating word-line WL may have a word-line level (ARL2<NRL) set lower than the recovery level NRL of the normal operation. By setting the voltage of the floating word-line WL relatively low, the charge gain may be relatively reduced as compared to the example in which the voltage is not relatively low. The word-line recovery control operation may be a customized reliability improvement operation based on the wear-out information.

The word-line recovery control operation in an example embodiment may be implemented in various ways to control the level of the final floating word-line.

Figure 12:
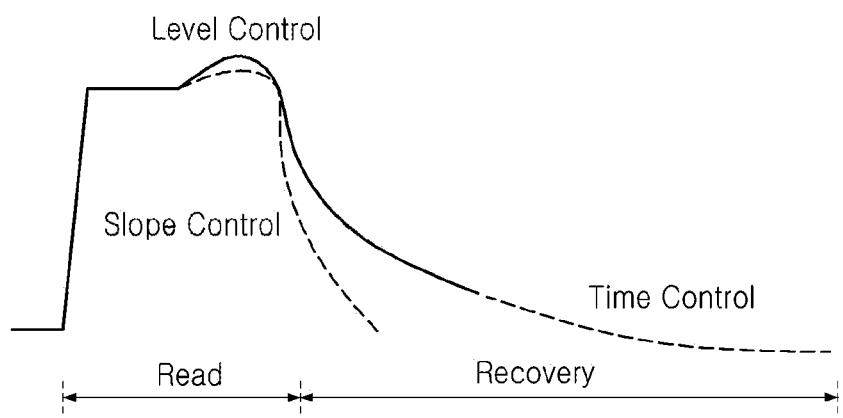
FIG. 12 is a diagram illustrating a word-line recovery control operation of a read operation according to an example embodiment of the present disclosure.

FIG. 12 is a diagram illustrating a word-line recovery control operation of a read operation according to an example embodiment. Referring to FIG. 12, the word-line recovery control operation may include controlling a recovery level, controlling a recovery slope, or controlling a recovery time.

Figure 13A:
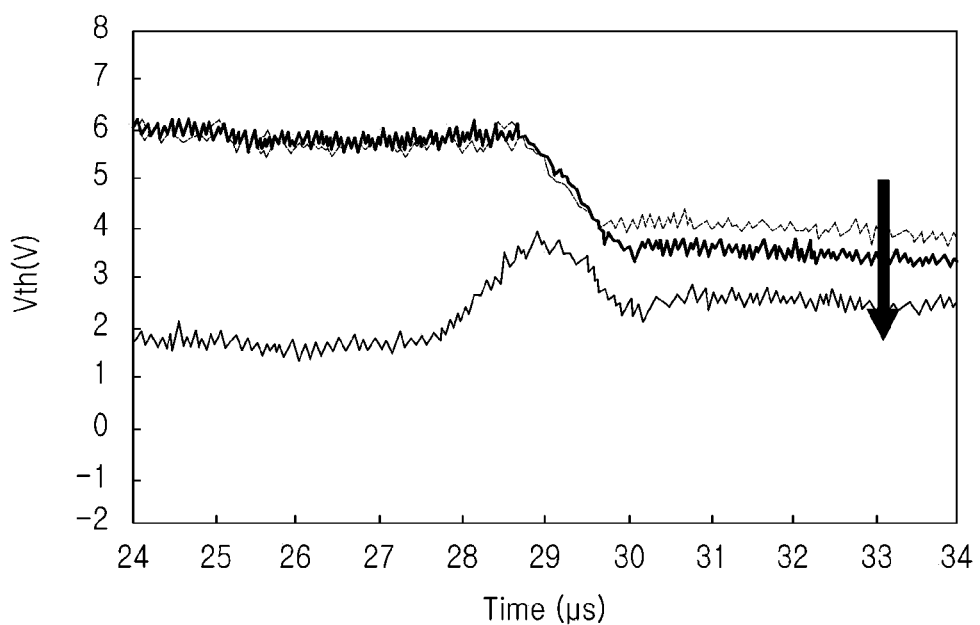
FIGS. 13A, 13B, and 13C are diagrams illustrating a method of performing a word-line recovery control operation according to an example embodiment of the present disclosure.
Figure 13B:
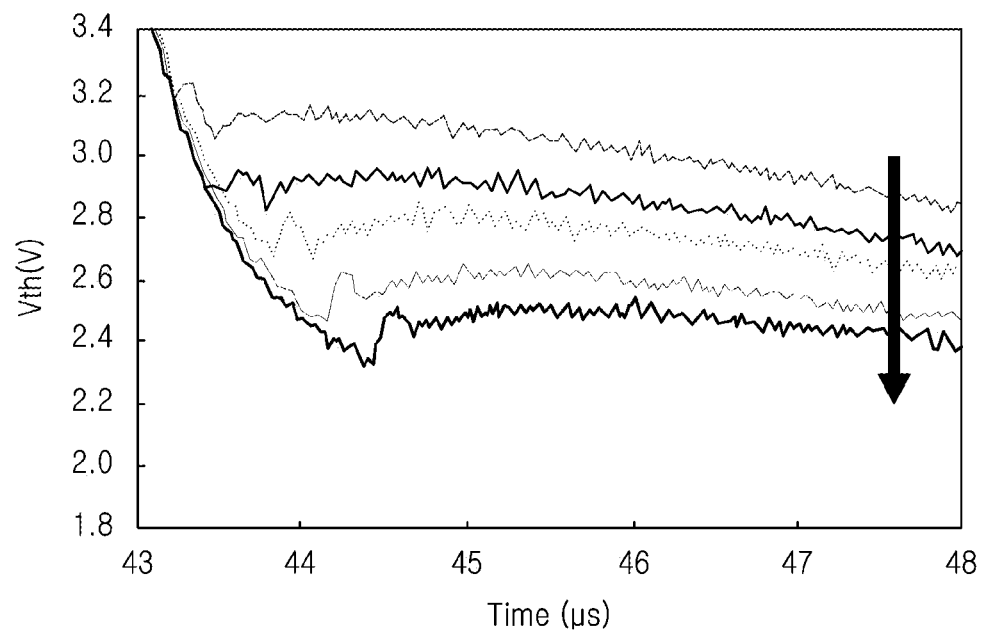
Figure 13C:
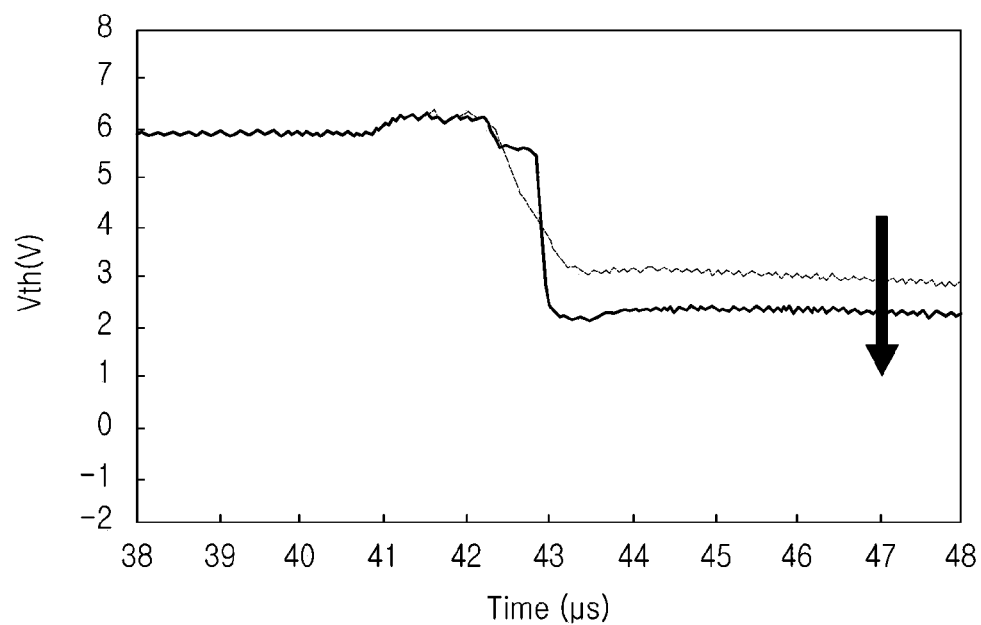

FIGS. 13A, 13B, and 13C are diagrams illustrating examples of a method of performing a word-line recovery control operation.

FIG. 13A illustrates a word-line recovery control operation of adjusting a word-line to potential by varying the recovery level. When the wear-out information of the memory block indicates charge gain, the recovery level of the selected word-line may be set lower than that of the normal operation mode as illustrated in FIG. 13B. Also, the recovery level of the selected word-line may be set higher than that of the unselected word-line. The change in the recovery level is merely an example.

FIG. 13B illustrates a word-line recovery control operation of adjusting a word-line to potential by varying the recovery time. As illustrated in FIG. 13B, shortening the recovery time may lower the level of the floating word-line as compared to the example in which the recovery time is not shortened. This change between the recovery time and the recovery level is only an example.

FIG. 13C illustrates a word-line recovery control operation of adjusting a word-line to potential by varying a recovery path. As illustrated in FIG. 13C, the level of the floating word-line may change depending on how the discharge path of the word-line recovery current is set. For example, discharging the word-line recovery current towards the memory cell array may further lower the recovery level rather than discharging the current towards the row decoder. This change between the recovery discharge path and the recovery level is merely an example.

Figures 14, 15:
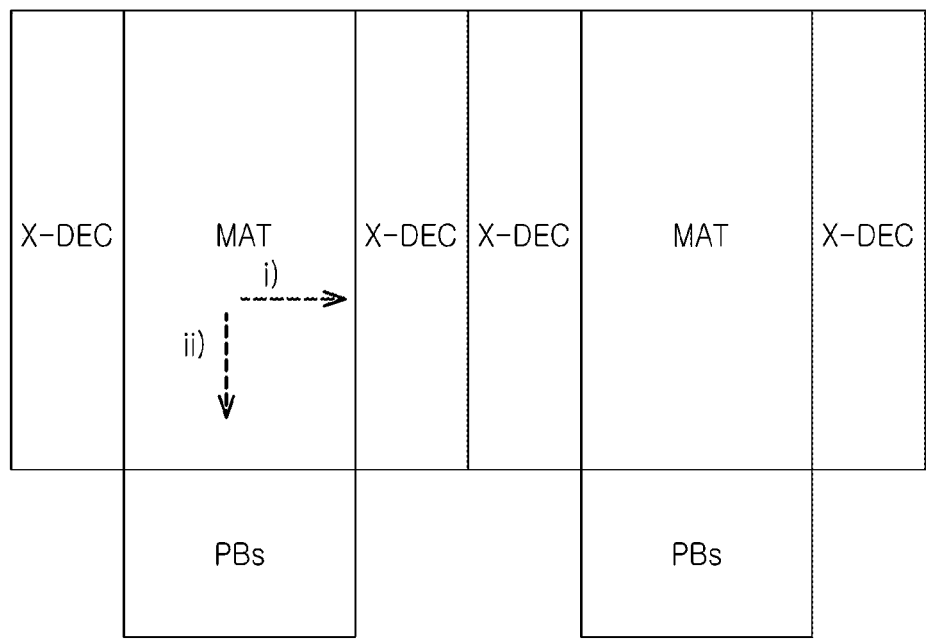
FIG. 14 is a diagram illustrating a discharge path of a word-line recovery current according to an example embodiment of the present disclosure.
FIG. 15 is a diagram illustrating a word-line recovery mode table of a non-volatile memory device according to an example embodiment of the present disclosure.

FIG. 14 is a diagram illustrating a discharge path of a word-line recovery current according to an example embodiment. Referring to FIG. 14, the word-line recovery current may be discharged in i) an direction of an address decoder (X-DEC) or ii) a direction of the stacked memory block MAT (the direction of the peripheral region). The recovery level of the floating word-line may vary according to the discharge path of the recovery current.

The non-volatile memory device 100 in the example embodiment may be implemented to select a discharge path in a recovery operation.

The word-line recovery control operation in an example embodiment may be performed by a word-line recovery mode table.

FIG. 15 is a diagram illustrating a word-line recovery mode table of a non-volatile memory device according to an example embodiment. Referring to FIG. 15, the word-line recovery mode table may include a recovery time, a recovery pass, and a recovery level according to written wear-out information. The word-line recovery control operation may be performed according to the word-line recovery mode table.

The non-volatile memory device 100 in an example embodiment may check a neglect pattern of an invalid block, and may perform a word-line recovery level control operation on the basis of the word-line recovery mode table during a reprogramming or reclaim write operation. Accordingly, the non-volatile memory device 100 in an example embodiment may improve reliability characteristics as compared to that of a conventional non-volatile memory device.

Figure 16:
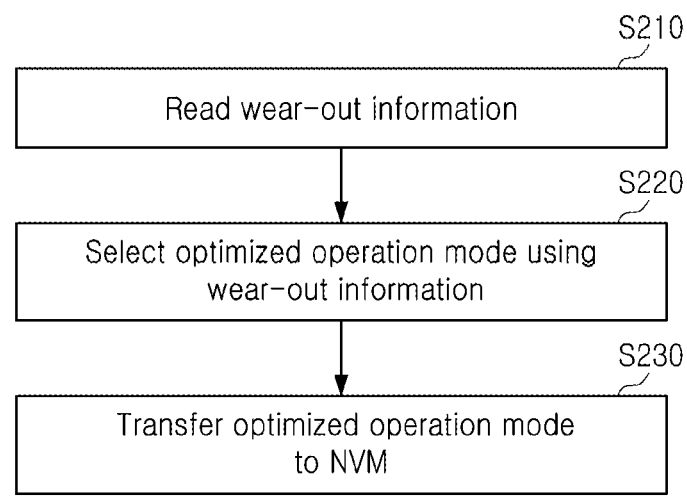
FIG. 16 is a flowchart illustrating an operating method of a storage device according to an example embodiment of the present disclosure.

FIG. 16 is a flowchart illustrating an operating method of a storage device 10 according to an example embodiment. Referring to FIGS. 1 to 16, the storage device 10 may operate as follows.

The controller 200 (see FIG. 1) may read wear-out information of a memory block to perform an operation (S210). The controller 200 may select an optimal operation mode on the basis of the wear-out information (S220). The controller 200 may transmit an optimal operation mode and an operation command to the non-volatile memory device 100 (S230). The non-volatile memory device 100 may perform an operation (e.g., normal operation or advanced operation, for example as discussed above in FIGS. 9A to 9C), in response to receiving the operation mode and the operation command from the controller 200.

Figure 17A:
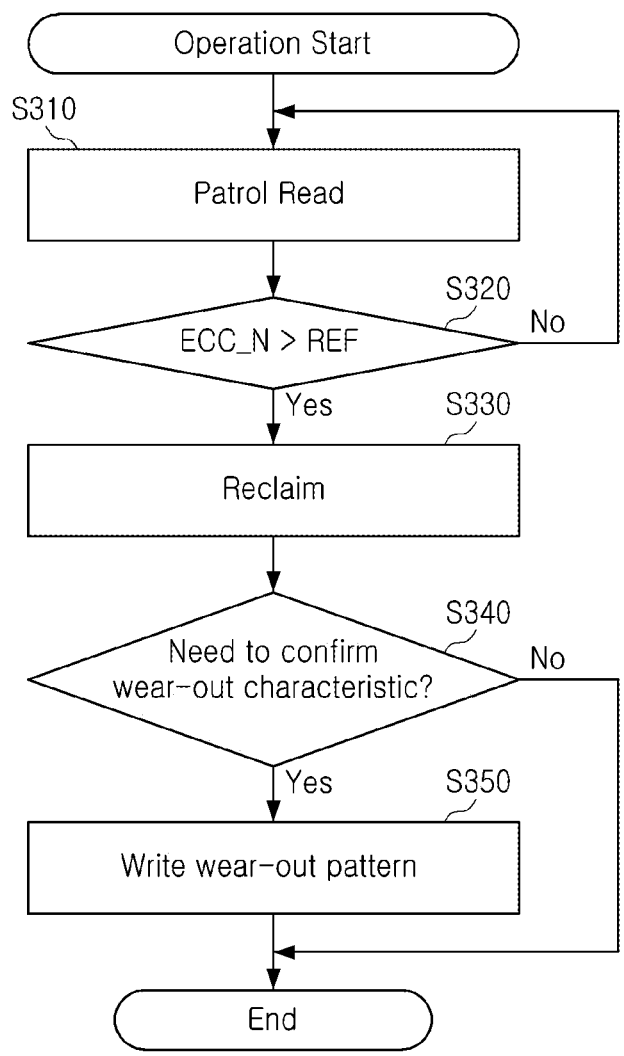
FIG. 17A is a flowchart illustrating a reclaim operation of a storage device according to an example embodiment of the present disclosure.

FIG. 17A is a flowchart illustrating a reclaim operation of a storage device according to an example embodiment. Referring to FIGS. 1 to 17A, the reclaim operation of the storage device 10 may be performed as follows.

The controller 200 (see FIG. 1) of the storage device 10 may perform a patrol read operation on a block (or a valid block) written periodically or aperiodically (S310). The patrol read operation may include a read operation with respect to a desired and/or alternatively predetermined position of the memory block. In an example embodiment, the patrol read operation may be performed as a background operation.

As a result of the performing the patrol read operation, the controller 200 may determine whether the number of errors ECC_N in the error correction circuit is greater than the reference value REF. When the number of errors ECC_N is not greater than the reference value REF, operation S310 may be performed. When the number of errors ECC_N is greater than the reference value REF, the controller 200 may perform a reclaim operation on the memory block (S330). Accordingly, valid data of the memory block may be programmed in a new block. Thereafter, the controller 200 may determine whether it is necessary to check the wear-out characteristic of the original memory block (S340). When it is necessary to determine the wear-out characteristic of the original memory block, the controller 200 may determine the retention characteristic of the original memory block. This retention characteristic may be determined on the basis of a distribution characteristic of memory cells connected to a specific word-line in the memory block. In an example embodiment, the retention characteristic may be determined on the basis of cell count information corresponding to the threshold voltage distribution. Thereafter, the controller 200 may write a wear-out pattern corresponding to the identified retention characteristic in the original memory block (S350). Thereafter, the reclaim operation may be completed. Also, when there is no need to determine the wear-out characteristic for the original memory block, the reclaim operation may be completed immediately.

Figure 17B:
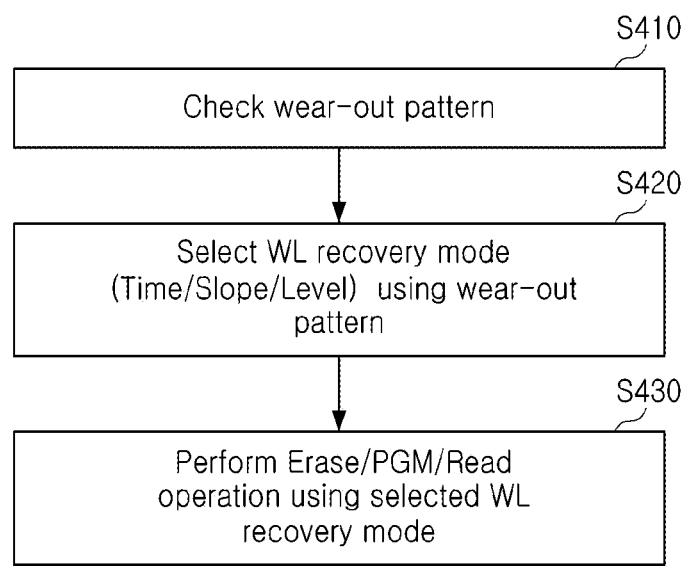
FIG. 17B is a flowchart illustrating an operating method of a non-volatile memory device according to an example embodiment of the present disclosure.

FIG. 17B is a flowchart illustrating an operating method of a non-volatile memory device according to an example embodiment. Referring to FIGS. 1 to 17B, the non-volatile memory device 100 may operate as follows.

The non-volatile memory device 100 may check the wear-out pattern of the memory block according to a request of the controller 200 (S410). The wear-out pattern may be checked through the state of the memory cell or the state of the flag cell. Thereafter, the non-volatile memory device 100 may select a word-line recovery mode according to the checked wear-out pattern (S420). The word-line recovery mode may be set in various manners according to time/slope/level control. In an example embodiment, the word-line recovery mode may be set by the controller 200. In another example embodiment, the word-line recovery mode may be internally set in the non-volatile memory device 100 according to the checked wear-out information.

Thereafter, the non-volatile memory device 100 may perform an erase/program/read operation using the selected word-line recovery mode (S430).

Figure 18:
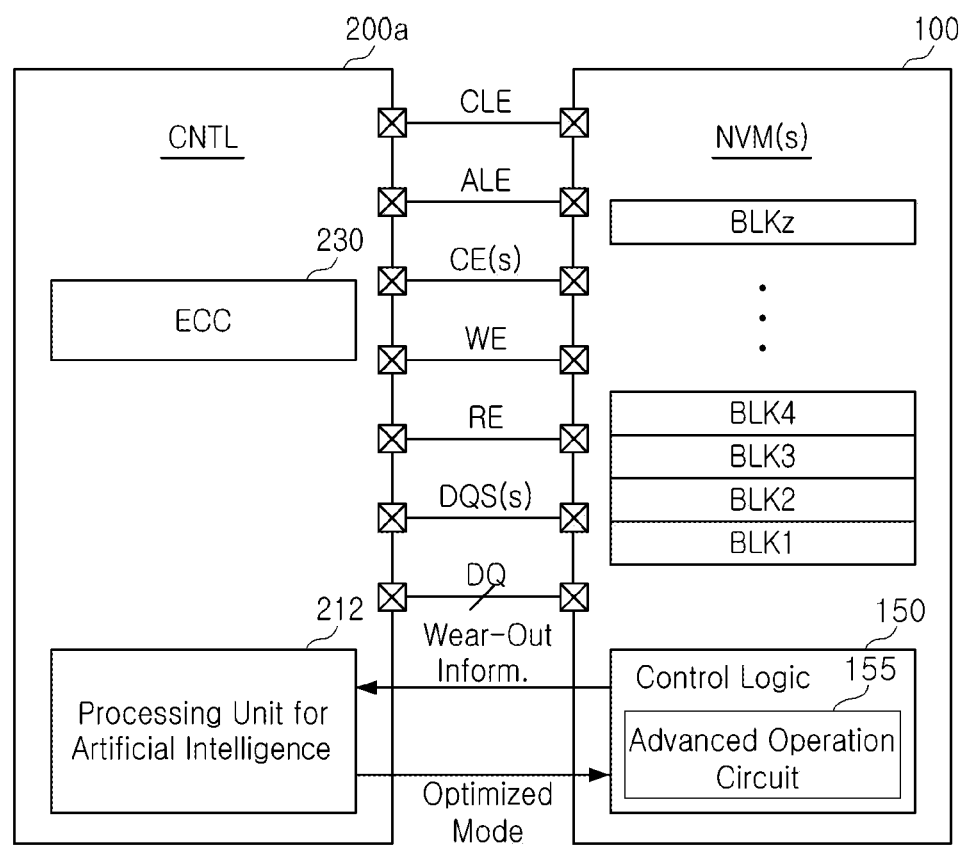
FIG. 18 is a diagram illustrating a storage device according to another example embodiment of the present disclosure.

FIG. 18 is a diagram illustrating a storage device according to another example embodiment. Referring to FIG. 18, the storage device 20 may include at least one non-volatile memory device 100 and a controller 200a controlling the same.

The controller CNTL (200a) may be connected to at least one non-volatile memory device 100 through a plurality of control pins transmitting control signals (CLE, ALE, CE(s), WE, RE, etc.). Also, the controller CNTL (200a) may be implemented to control the non-volatile memory device 100 using control signals (CLE, ALE, CE(s), WE, and RE). For example, the non-volatile memory device 100 may latch a command or an address on an edge of a write enable (WE) signal according to a command latch enable (CLE) signal and an address latch enable (ALE) signal, thereby performing a program operation/read operation/erase operation.

The controller 200a may be implemented to control overall operation of the storage device 20. The controller 200a may perform various management operations such as cache/buffer management, firmware management, garbage collection management, wear leveling management, data deduplication management, read refresh/reclaim management, bad block management, multi-stream management, mapping of host data and non-volatile memory Management, quality of service (QoS) management, system resource allocation management, non-volatile memory queue management, read voltage level management, erase/program management, hot/cold data management, power loss protection management, dynamic thermal management, initialization management, redundant array of inexpensive disk (RAID) management, etc.

Also, the controller 200a may include an artificial intelligence processor 212 and an error correction circuit 230. The artificial intelligence processor 212 may optimally manage the operation mode of the memory block using the wear-out information of the memory block using artificial intelligence as described in FIGS. 1 to 17B.

The ECC circuit 230 may be implemented to generate an error correction code during a program operation and to recover data DATA using an error correction code during a read operation. In other words, the ECC circuit 230 may generate an error correction code (ECC) for correcting a fail bit or an error bit of the data DATA received from the non-volatile memory device 100. The ECC circuit 230 may, by performing error correction encoding of data provided to the non-volatile memory device 100, form data DATA to which a parity bit is added. The parity bit may be stored in the non-volatile memory device 100. Also, the ECC circuit 230 may perform error correction decoding on the data DATA output from the non-volatile memory device 100. The ECC circuit 230 may correct an error using parity. ECC circuit 230 may correct an error using an low density parity check (LDPC) code, a BCH code, a turbo code, a reed-solomon code, a convolution code, a recursive systematic code (RSC), a coded modulation such as a trellis-coded modulation (TCM) and a block coded modulation (BCM).

Figure 19:
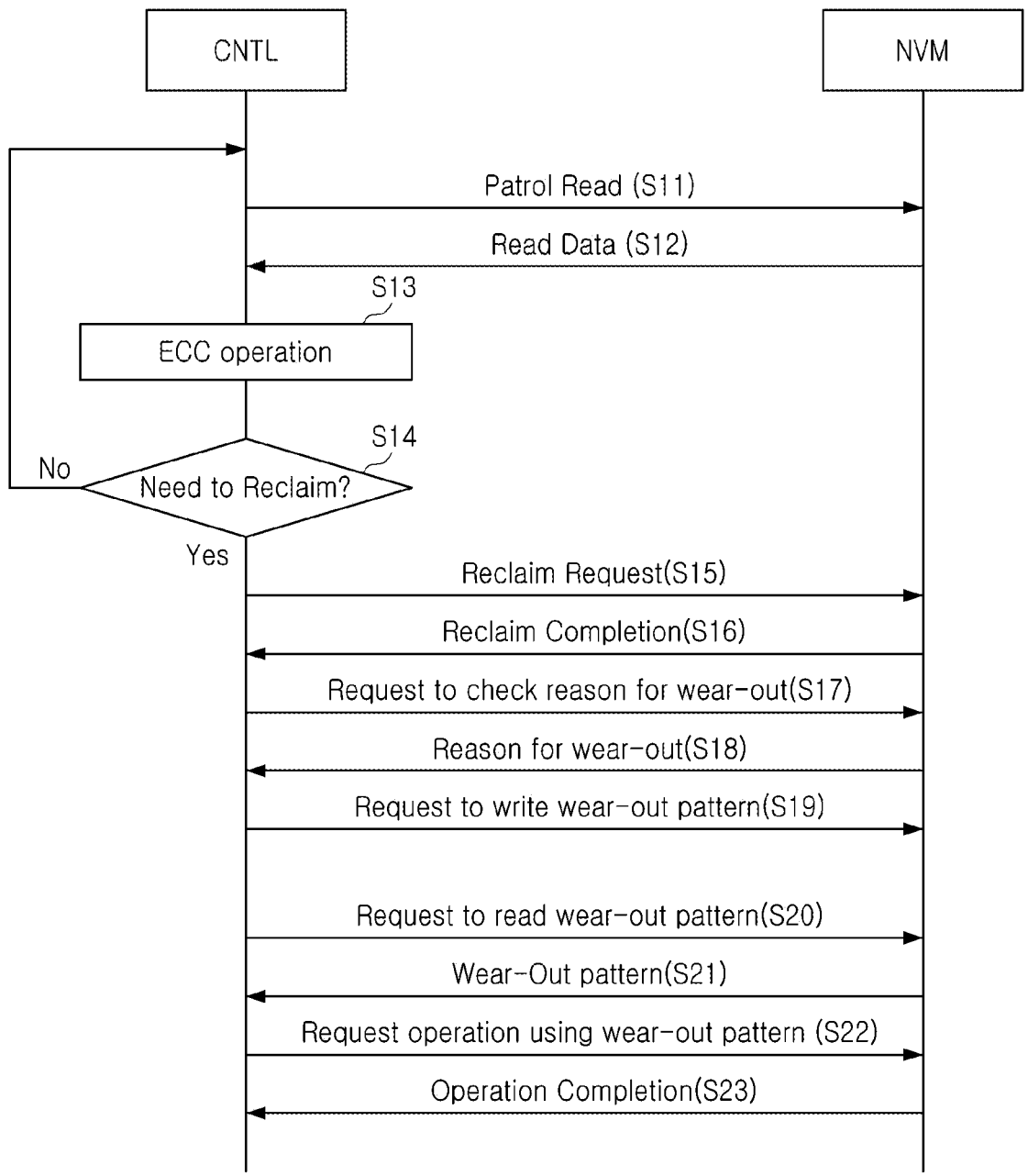
FIG. 19 is a ladder diagram illustrating a process of performing an operation according to an optimal operation mode on the basis of wear-out information in a storage device according to an example embodiment of the present disclosure.

FIG. 19 is a ladder diagram illustrating a process of performing an operation according to an optimal operation mode on the basis of wear-out information in a storage device 10 according to an example embodiment. Referring to FIGS. 1 to 19, the operation of the storage device 10 may be performed as follows.

The controller CNTL of the storage device 10 may request a patrol read operation for any one memory block to the non-volatile memory device NVM according to an internal policy (S11). The non-volatile memory device NVM may transmit data corresponding to the patrol read operation to the controller CNTL (S12).

Thereafter, the controller CNTL may perform an error correction operation on the read data received from the non-volatile memory device NVM (S13). Thereafter, as a result of performing the error correction operation, it may be determined whether a reclaim operation is necessary (S14). For example, the controller CNTL may determine a reclaim operation is necessary in response to a number of uncorrectable errors after the ECC operation exceeding a threshold level and the ECC operation is not necessary in response the number of uncorrectable errors being lower than or equal to the threshold level. In the case in which the reclaim operation is not required, a patrol read operation for another memory block may be performed.

In the case in which a reclaim operation is necessary, the controller CNTL may transmit a reclaim request for the memory block to the non-volatile memory device NVM (S15). The controller CNTL may receive the completion of the reclaim (S16) and may transmit the same to the non-volatile memory device NVM to check a wear-out reason for the memory block (S17). The controller CNTL may receive information corresponding to the wear-out reason from the non-volatile memory device NVM (S18), and may request the non-volatile memory device NVM to write the wear-out pattern corresponding to the received wear-out information in the memory block (S19). Thereafter, the memory block may be neglected.

Thereafter, when attempting to reuse the neglected memory block, the controller CNTL may request the non-volatile memory device NVM to read the wear-out pattern in the memory block (S20). Thereafter, the controller CNTL may receive the wear-out pattern from the non-volatile memory device NVM (S21). Thereafter, the controller CNTL may request the non-volatile memory device NVM to perform an operation using the wear-out pattern in the memory block (S22). The controller CNTL may receive the completion of the operation from the non-volatile memory device NVM (S23).

The operation mode management operation for the non-volatile memory device in an example embodiment may be performed by a processor for artificial intelligence.

The non-volatile memory device in an example embodiment may be implemented in a C2C (chip to chip) structure.

Figure 20:
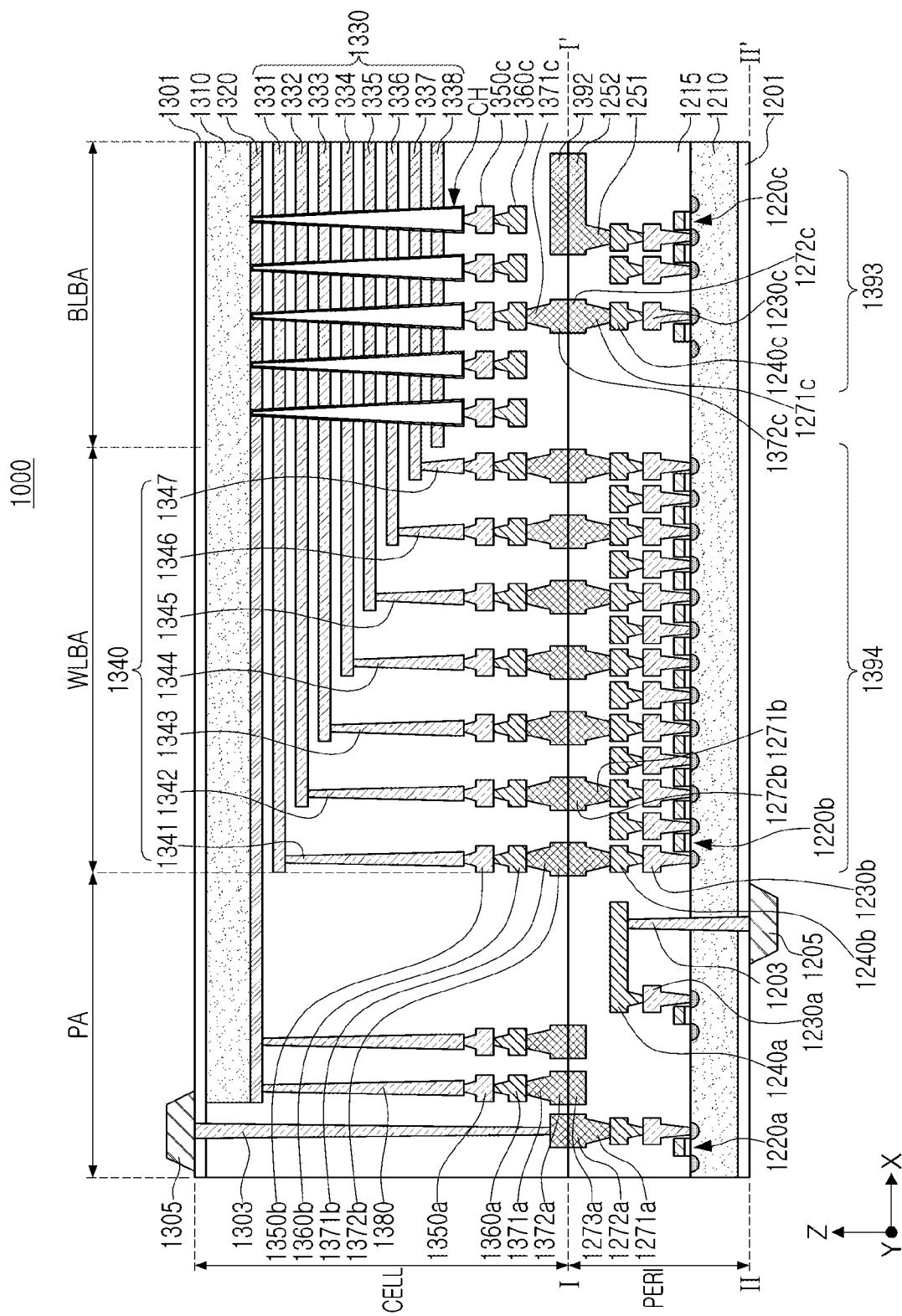
FIG. 20 is a diagram illustrating a non-volatile memory device implemented in a C2C structure according to an example embodiment of the present disclosure.

FIG. 20 is a diagram illustrating a non-volatile memory device 1000 implemented in a C2C structure according to an example embodiment. In the C2C structure, an upper chip including a cell region (CELL) may be manufactured on a first wafer, a lower chip including a peripheral circuit region (PERI) may be manufactured on a second wafer different from the first wafer, and the upper chip and the lower chip may be connected to each other by a bonding method. For example, the bonding method may be a method of electrically connecting a bonding metal formed on an uppermost metal layer of the upper chip to a bonding metal formed on an uppermost metal layer of the lower chip. In an example embodiment, when the bonding metal is formed of copper (Cu), the bonding method may be a Cu—Cu bonding method. In another example embodiment, the bonding metal may be formed of aluminum or tungsten.

Each of the peripheral circuit region PERI and the cell region CELL of the non-volatile memory device 1000 may include an external pad bonding region PA, a word-line bonding region WLBA, and a bit-line bonding region BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, 1230c connected to the plurality of circuit elements 1220a, 1220b, and 1220c, respectively, and second metal layers 1240a, 1240b, 1240c formed on the first metal layers 1230a, 1230b, and 1230c. In an example embodiment, the first metal layers 1230a, 1230b, and 1230c may be formed of tungsten having a relatively high resistivity. In an example embodiment, the second metal layers 1240a, 1240b, and 1240c may be formed of copper having a relatively low resistivity.

As illustrated in FIG. 20, the first metal layer (1230a, 1230b, 1230c) and the second metal layer (1240a, 1240b, 1240c) are illustrated, but an example embodiment thereof is not limited thereto. At least one metal layer may be further formed on the metal layers 1240a, 1240b, and 1240c. At least a portion of the one or more metal layers formed on the second metal layers 1240a, 1240b, and 1240c may be formed of aluminum having resistivity different from that of copper forming the second metal layers 1240a, 1240b, and 1240c.

In an example embodiment, the interlayer insulating layer 1215 may be disposed on the first substrate 1210 to cover the plurality of circuit elements 1220a, 1220b, and 1220c, the first metal layers 1230a, 1230b, and 1230c, and the second metal layers 1240a, 1240b, and 1240c. In an example embodiment, the interlayer insulating layer 1215 may include an insulating material such as silicon oxide or silicon nitride.

Lower bonding metals 1271b and 1272b may be formed on the second metal layer 1240b of the word-line bonding region WLBA. In the word-line bonding region WLBA, the lower bonding metals 1271b and 1272b of the peripheral circuit region PERI may be electrically connected to upper bonding metals 1371b and 1372b of the cell region CELL through a bonding method. In an example embodiment, the lower bonding metals 1271b and 1272b and the upper bonding metals 1371b and 1372b may be formed of aluminum, copper, or tungsten.

The cell region CELL may include at least one memory block. In an example embodiment, the cell region CELL may include the second substrate 1310 and the common source line 1320. On the second substrate 1310, a plurality of word-lines 1331-338 and 330 may be stacked along a direction perpendicular to an upper surface of the second substrate 1310 (Z-axis direction). In an example embodiment, string select lines and ground select lines may be disposed on each of the upper and lower portions of the word-lines 1330. In an example embodiment, a plurality of word-lines 1330 may be disposed between the string select lines and the ground select line.

In the bit-line bonding region BLBA, the channel structure CH may extend in a direction perpendicular to the upper surface of the second substrate 1310 and may penetrate word-lines 1330, string select lines, and ground select lines. The channel structure CH may include a data storage layer, a channel layer, and a buried insulating layer, and the channel layer may be electrically connected to the first metal layer 1350c and the second metal layer 1360c. For example, the first metal layer 1350c may be a bit-line contact, and the second metal layer 1360c may be a bit-line. In an example embodiment, the bit-line 1360c may extend along a first direction (Y-axis direction) parallel to the upper surface of the second substrate 1310.

As illustrated in FIG. 20, a region in which the channel structure CH and the bit-line 1360c are disposed may be defined as the bit-line bonding region BLBA. In an example embodiment, the bit-line 1360c may be electrically connected to the circuit elements 1220c providing the page buffer 1393 in the peripheral circuit region PERI in the bit-line bonding region BLBA. For example, the bit-line 1360c may be connected to the upper bonding metals 1371c and 1372c in the peripheral circuit region PERI. The upper bonding metals 1371c and 1372c may be connected to the lower bonding metals 1271c and 1272c connected to the circuit elements 1220c of the page buffer 1393.

In the word-line bonding region WLBA, the word-lines 1330 may extend along a second direction (X-axis direction) parallel to the upper surface of the second substrate 1310. In an example embodiment, the word-line bonding region WLBA may be connected to the plurality of cell contact plugs 1341 to 1347 (1340). For example, the word-lines 1330 and the cell contact plugs 1340 may be connected to each other in pads provided by extending at least a portion of the word-lines 1330 by different lengths along the second direction. In an example embodiment, the first metal layer 1350b and the second metal layer 1360b may be connected in order to upper portions of the cell contact plugs 1340 connected to the word-lines 1330. In an example embodiment, the cell contact plugs 1340 may be connected to the peripheral circuit region PERI through the upper bonding metals 1371b and 1372b of the cell region CELL and lower bonding metals 1271b and 1272b of the peripheral circuit region PERI in the word-line bonding region WLBA.

In an example embodiment, the cell contact plugs 1340 may be electrically connected to the circuit elements 1220b providing the row decoder 1394 in the peripheral circuit region PERI. In an example embodiment, an operating voltage of the circuit elements 1220b providing the row decoder 1394 may be different from an operating voltage of the circuit elements 1220c providing the page buffer 1393. For example, the operating voltage of the circuit elements 1220c providing the page buffer 1393 may be greater than the operating voltage of the circuit elements 1220b providing the row decoder 1394.

A common source line contact plug 1380 may be disposed in the external pad bonding region PA. In an example embodiment, the common source line contact plug 1380 may be formed of a conductive material such as a metal, a metal compound, or polysilicon. The common source line contact plug 1380 may be electrically connected to the common source line 1320. The first metal layer 1350a and the second metal layer 1360a may be stacked in order on the common source line contact plug 1380. For example, a region in which the common source line contact plug 1380, the first metal layer 1350a, and the second metal layer 1360a are disposed may be defined as an external pad bonding region PA.

Input/output pads 1205 and 1305 may be disposed in the external pad bonding region PA. Referring to FIG. 20, a lower insulating layer 1201 covering a lower surface of the first substrate 1210 may be formed in a lower portion the first substrate 1210. Also, a first input/output pad 1205 may be formed on the lower insulating layer 1201. In an example embodiment, the first input/output pad 1205 may be connected to at least one of a plurality of circuit elements 1220a, 1220b, and 1220c disposed in the peripheral circuit region PERI through the first input/output contact plug 1203. In an example embodiment, the first input/output pad 1205 may be separated from the first substrate 1210 by the lower insulating layer 1201. Also, since a side insulating layer is disposed between the first input/output contact plug 1203 and the first substrate 1210, the first input/output contact plug 1203 and the first substrate 1210 may be electrically separated from each other.

Referring to FIG. 20, an upper insulating layer 1301 may be formed on the second substrate 1310 to cover the upper surface of the second substrate 1310. Also, a second input/output pad 1305 may be disposed on the upper insulating layer 1301. In an example embodiment, the second input/output pad 1305 may be connected to at least one of a plurality of circuit elements 1220a, 1220b, and 1220c disposed in the peripheral circuit region PERI through the second input/output contact plug 1303.

In an example embodiment, the second substrate 1310 and the common source line 1320 may not be disposed in a region in which the second input/output contact plug 1303 is disposed. Also, the second input/output pad 1305 may not overlap the word-lines 1380 in the third direction (Z-axis direction). Referring to FIG. 20, the second input/output contact plug 1303 may be separated from the second substrate 1310 in a direction parallel to the upper surface of the second substrate 1310. Also, the second input/output contact plug 1303 may penetrate through the interlayer insulating layer 1315 of the cell region CELL and may be connected to the second input/output pad 1305.

In an example embodiment, the first input/output pad 1205 and the second input/output pad 1305 may be selectively formed. For example, the non-volatile memory device 1000 may only include the first input/output pad 1205 disposed in an upper portion of the first substrate 1201 or a second input/output pad 1305 disposed in an upper portion the second substrate 1301. In another example embodiment, the non-volatile memory device 1000 may include both the first input/output pad 1205 and the second input/output pad 1305.

The metal pattern of the uppermost metal layer may be present as a dummy pattern in each of the external pad bonding region PA and the bit-line bonding region BLBA included in the cell region CELL and the peripheral circuit region PERI, respectively, or the uppermost metal layer may be empty.

In the non-volatile memory device 1000, in an example embodiment, in the external pad bonding region PA, a lower metal pattern 1273a having the same shape as that of the upper metal pattern 1372a of the cell region CELL may be formed on the uppermost metal layer of the peripheral circuit region PERI to correspond to the per metal pattern 1372a formed on the uppermost metal layer of the cell region CELL. The lower metal pattern 1273a formed on the uppermost metal layer of the peripheral circuit region PERI may not be connected to a contact in the peripheral circuit region PERI. Similarly, in the external pad bonding region PA, an upper metal matter having the same shape as that of the lower metal pattern of the peripheral circuit region PERI may also be formed on the upper metal layer of the cell region CELL to correspond to the lower metal pattern formed on the uppermost metal layer of the peripheral circuit region PERI.

Lower bonding metals 1271b and 272b may be formed on the second metal layer 1240b of the word-line bonding region WLBA. In an example embodiment, the lower bonding metals 1271b and 272b of the peripheral circuit region PERI in the word-line bonding region WLBA may be electrically connected to the upper bonding metals 1371b and 372b of the cell region CELL by a bonding method Also, in the bit-line bonding region BLBA, an upper metal pattern 1392 having the same shape as that of the lower metal pattern 1252 may be formed on the uppermost metal layer of the cell region CELL to correspond to the lower metal pattern 1252 formed on the uppermost metal layer of the peripheral circuit region PERI. A contact may not be formed on the upper metal pattern 1392 formed on the uppermost metal layer of the cell region CELL.

A non-volatile memory device in an example embodiment may include a memory cell region including a memory cell array, and a peripheral circuit region including at least one of a row decoder, a plurality of page buffers, and control logic, and the memory cell region and the peripheral circuit region may be electrically connected to each other by pads formed in opposite extension directions.

In an example embodiment, the memory cell region may be formed on the first wafer, and the peripheral circuit region may be formed on a second wafer different from the first wafer.

In general, a vertical NAND flash memory (VNAND) may have different retention characteristics according to WL to channel potential. In the case in which the WL to channel potential is high, charge loss of an upper state may improve, but charge gain of a lower state may deteriorate. Therefore, an optimal window of charge loss and charge gain may be present according to WL to channel potential. Also, WL to channel potential control may improve reliability. When reusing an inactive block using WL to channel potential control, by controlling WL (word-line) recovery on the basis of the cause of wear-out before inactivity, reliability may improve through WL to channel potential improvement.

WL to channel potential may be adjusted through WL recovery control, which may lead to improvement of retention and reliability. When reusing an inactive block, in the case in which charge loss is worse or the neglected pattern is high when checking the retention characteristics before an inactive block through a read operation, retention may improve by raising the WL recovery level. Accordingly, lifespan may increase.

In general, since VNAND is a floating body, the WL to channel potential changes according to the WL recovery level. When the WL recovery level is low, the WL to channel potential decreases, such that the charge loss characteristics may deteriorate and the charge gain characteristics may improve. In an example embodiment, three WL recovery control methods for adjusting the WL to channel potential may be presented. The first method is to reduce the WL to channel potential by varying the WL recovery time. The second method is to lower resistance through a MAT cross recovery method for adjusting WL recovery path and to improve a recovery slope, thereby reducing the final WL to channel potential. The third method is to reduce the WL to channel potential by varying the WL recovery level.

The word-line recovery control method of example embodiments is not limited to a VNAND flash memory, and may be applied to various types of memory devices having a floating body.

According to example embodiments, the non-volatile memory device, the operating method thereof, the controller for controlling the same, and the storage device including the same may select an optimal operation mode using wear-out information of a memory block and may perform a core operation according to the selected optimal operation mode, thereby improving reliability of the memory block.

Also, the non-volatile memory device, the operating method thereof, the controller for controlling the same, and the storage device including the same may have extended lifespan by improving reliability of a memory block.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments have been illustrated and described above, it will be apparent to those skilled in the art that modifications and variations may be made without departing from the scope of inventive concepts in the present disclosure as defined by the appended claims.

What is claimed is:

1. An operating method of a storage device, the method comprising:
   reading a wear-out pattern of a memory block when a controller determines the memory block is a re-use memory block of a non-volatile memory device;
   selecting an operation mode corresponding to the wear-out pattern using the controller; and
   transmitting the operation mode to the non-volatile memory device using the controller.

2. The method of claim 1, wherein the wear-out pattern is stored in a meta region of the non-volatile memory device or in the memory block of the non-volatile memory device.

3. The method of claim 1, wherein the wear-out pattern includes information on charge loss or charge gain of the memory block.

4. The method of claim 1, wherein the selected operation mode includes an advanced operation mode for improving reliability.

5. The method of claim 4, wherein, in a program operation, a read operation, or an erase operation, the advanced operation mode varies a word-line recovery level, differently from a normal operation mode, according to the wear-out pattern.

6. The method of claim 1, wherein the non-volatile memory device includes a memory cell region and a peripheral circuit region,
   the memory cell region has a first metal pad, and
   the peripheral circuit region has a second metal pad and is vertically connected to the first metal pad through the second metal pad, and
   the first metal pad is connected to the second metal pad by a bonding method.

7. The method of claim 6,
   wherein the memory cell region is on a first wafer, and
   wherein the peripheral circuit region is on a second wafer different from the first wafer.

8. The method of claim 6, wherein
   an extension direction of a first plug corresponding to the first metal pad and an extension direction of a second plug corresponding to the second metal pad are opposite to each other.

9. An operating method of a storage device, the method comprising:
   reading a wear-out pattern of a memory block when a controller determines the memory block is a re-use memory block of a non-volatile memory device;
   selecting an operation mode corresponding to the wear-out pattern using the controller; and
   transmitting the operation mode to the non-volatile memory device using the controller;
   performing a patrol read operation for the memory block before the memory block is reused; and
   determining whether a reclaim is necessary as a result of the patrol read operation.

10. The method of claim 9, further comprising:
    performing the reclaim for the memory block when the reclaim is necessary for the memory block; and
    storing the wear-out pattern corresponding to the memory block.

* * * * *